United States Patent
Lee et al.

(10) Patent No.: US 8,445,340 B2
(45) Date of Patent: May 21, 2013

(54) SACRIFICIAL OFFSET PROTECTION FILM FOR A FINFET DEVICE

(75) Inventors: Tsung-Lin Lee, Hsinchu (TW); Feng Yuan, Yonghe (TW); Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 644 days.

(21) Appl. No.: 12/622,038

(22) Filed: Nov. 19, 2009

(65) Prior Publication Data

US 2011/0117679 A1 May 19, 2011

(51) Int. Cl.
*H01L 21/8232* (2006.01)
*H01L 21/84* (2006.01)

(52) U.S. Cl.
USPC ...... 438/163; 438/164; 438/300; 257/E21.43; 257/E21.431

(58) Field of Classification Search .......... 438/163, 438/300, 164; 257/E21.43, E21.431
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2006/0189043 A1* | 8/2006 | Schulz | 438/142 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0181477 A1 | 7/2009 | King et al. | |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0183961 A1 | 7/2010 | Shieh et al. | |
| 2010/0203734 A1 | 8/2010 | Shieh et al. | |
| 2010/0264468 A1 | 10/2010 | Xu | |

OTHER PUBLICATIONS

Cindy Wang et al., "FinFET Resistance Mitigation through Design and Process Optimization", 2009 IEEE, 978-1-4244-2785-7/09, pp. 127-128.

(Continued)

*Primary Examiner* — Zandra Smith
*Assistant Examiner* — Toniae Thomas
(74) *Attorney, Agent, or Firm* — Haynes and Boone, LLP

(57) ABSTRACT

A method for fabricating a semiconductor device is disclosed. An exemplary embodiment of the method includes providing a substrate; forming a fin structure over the substrate; forming a gate structure, wherein the gate structure overlies a portion of the fin structure; forming a sacrificial-offset-protection layer over another portion of the fin structure; and thereafter performing an implantation process.

20 Claims, 28 Drawing Sheets

OTHER PUBLICATIONS

Bartlomiej Jan Pawlak, et al., U.S. Appl. No. 12/569,689, "Method of Fabricating Finfet Device," filed Sep. 29, 2009, 21 pages.

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. CSU, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al., U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

SACRIFICIAL OFFSET PROTECTION FILM FOR A FINFET DEVICE

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin "fin" (or fin structure) extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Further advantages of FinFET devices include reducing the short channel effect and higher current flow.

As device structures become more dense, there have been problems associated with fabrication of FinFET devices. For example, conventional FinFET device fabrication methods utilize various implantation processes. The implantation processes may be used to form doped regions of the substrate, source and drain regions in the fin, etc. These implantation processes can induce damage (e.g., Si damage) and amorphorization effects in the substrate, fin, or other features, which can degrade device performance. As devices become smaller, Si damage and amorphorization effects cannot be easily remedied by subsequent processes, further exacerbating device performance issues. Accordingly, what is needed is a method for fabricating an IC device that addresses the above stated issues.

SUMMARY

The present disclosure provides for many different embodiments. An exemplary method for fabricating a FinFET device includes providing a substrate having a fin structure; forming a gate structure, wherein the gate structure overlies a portion of the fin structure; and forming a protection layer over the substrate, fin structure, and gate structure. After forming the protection layer, an implantation process is performed to form a source and drain region. A raised source and drain region are formed over the source and drain region. The protection layer may be removed from over the source and drain region prior to forming the raised source and drain region.

Another exemplary method includes providing a substrate having a fin structure; forming a gate stack, wherein the gate stack overlies a portion of the fin structure; and forming a protection layer over the substrate, fin structure, and gate stack. After forming the protection layer, an implantation process is performed to form a source and drain region. Spacers may be formed on sidewalls of the gate stack, and a raised source and drain region may be formed over the source and drain region.

Yet another exemplary method includes providing a substrate; forming a fin structure over the substrate; forming a gate structure, wherein the gate structure overlies a portion of the fin structure; forming a sacrificial-offset-protection layer over another portion of the fin structure; and thereafter performing an implantation process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
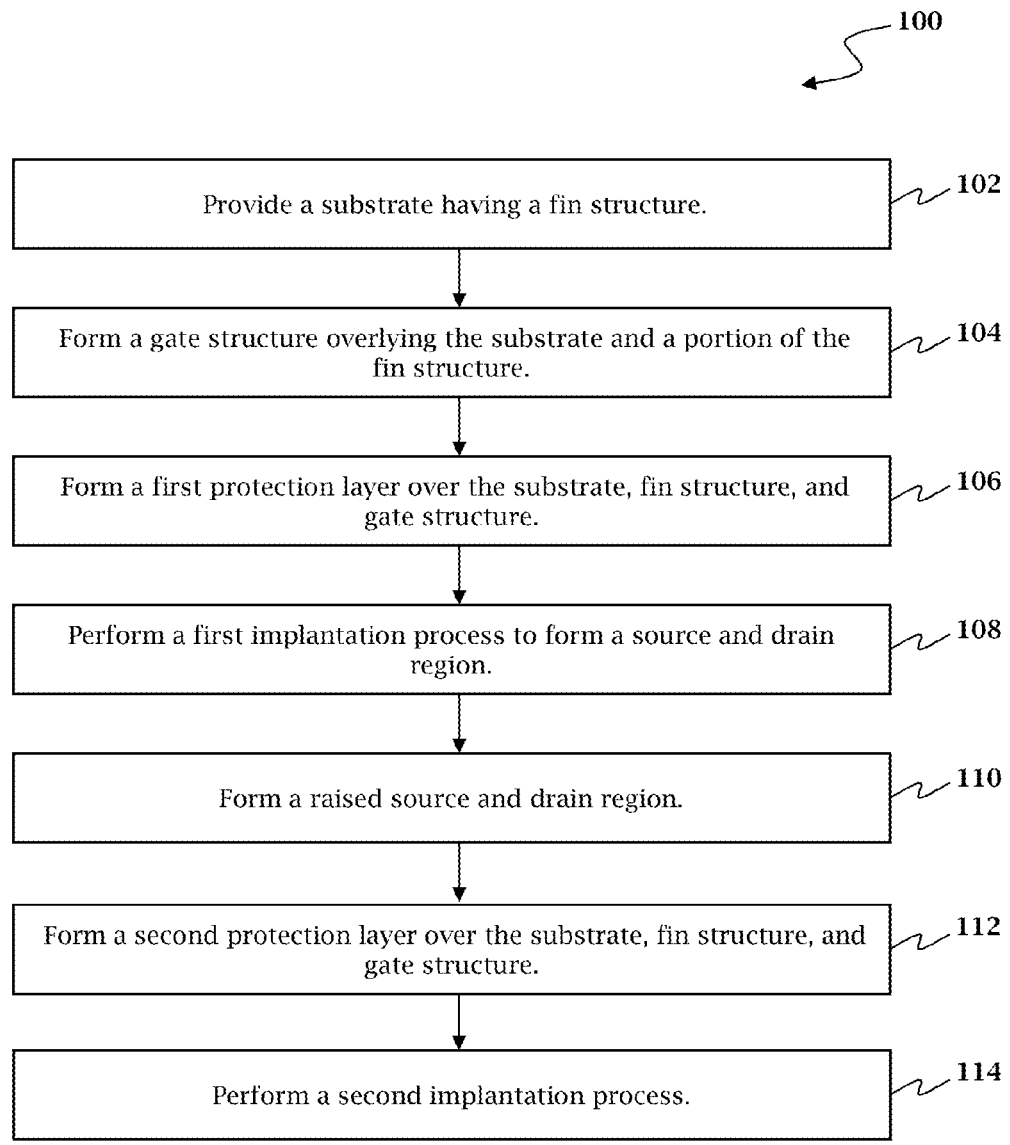
FIG. 1 is a flow chart of a method for fabricating an integrated circuit device according to aspects of the present disclosure.

The present disclosure relates generally to semiconductor devices, and more particularly, to a FinFET device and methods of fabricating a FinFET device (e.g., element or portion of a device/element).

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1, 2A-2F, 3, 4A-4F, 5, 6A-6F, 7, and 8A-8F, methods 100, 300, 500, 700 and semiconductor devices 200, 400, 600, 800 are collectively described below. The semiconductor devices 200, 400, 600, 800 illustrate a FinFET device (e.g., transistor) or any portion thereof (e.g., a fin). FIGS. 2A-2F, 4A-4F, 6A-6F, and 8A-8F provide two views of the FinFET devices 200, 400, 600, 800. The first view is a cross-section of the FinFET devices along a length of a fin structure (a portion of the FinFET devices), and the second view is a cross-section of the FinFET devices along a width of a fin structure (a portion of the FinFET devices). As employed in the present disclosure, the term FinFET device refers to any fin-based, multi-gate transistor. The FinFET devices 200, 400, 600, 800 may be included in a microprocessor, memory cell, and/or other integrated circuit devices. It is understood that additional steps can be provided before, during, and after the methods 100, 300, 500, 700, and some of the steps described below can be replaced or eliminated for additional embodiments of the methods. It is further understood that additional features can be added in the semiconductor devices 200, 400, 600, 800, and some of the features described below can be replaced or eliminated for additional embodiments of the semiconductor devices 200, 400, 600, 800.

Figure 2A:
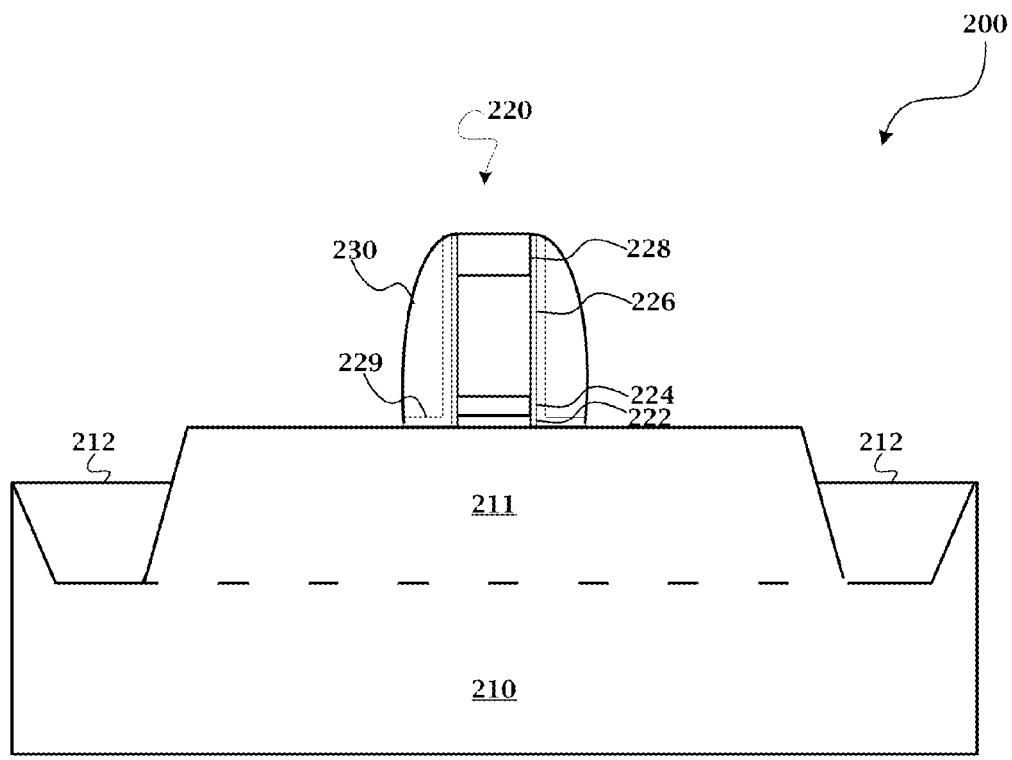
FIGS. 2A-2F are various cross-sectional views of embodiments of an integrated circuit device during various fabrication stages according to the method of FIG. 1.
Figure 2A:
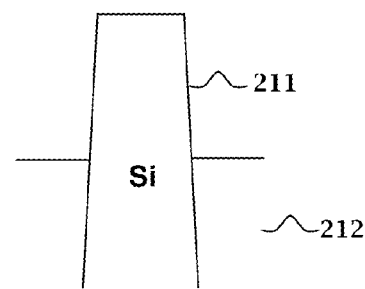

FIG. 1 illustrates a flow chart of an embodiment of the method 100 to fabricate the FinFET device 200. Referring to FIGS. 1 and 2A, at block 102, a substrate (wafer) 210 is provided having a fin structure 211. The substrate 210 comprises silicon in a crystalline structure. The substrate 210 comprises any suitable crystallographic orientation (e.g., a (100), (110), (111), or (001) crystallographic orientation). Alternatively, the substrate 210 comprises other suitable elementary semiconductors, such as germanium in crystal; a compound semiconductor, such as silicon carbide, gallium arsenic, gallium phosphide, indium phosphide, indium arsenide, and/or indium antimonide; or combinations thereof. Alternatively, the substrate 210 includes a silicon-on-insulator (SOI) substrate, which can be fabricated using separation by implantation of oxygen (SIMOX), wafer bonding, and/or other suitable methods.

The substrate 210 may also include an insulator layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET devices 200, the insulator layer is a component (e.g., layer) of a silicon-on-insulator substrate.

The substrate 210 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device and regions configured for a P-type metal-oxide-semiconductor transistor device.

The fin structure 211, formed over the substrate 210, comprises one or more fins. In the present embodiment, for simplicity, the fin structure 211 illustrates a single fin. The fins comprise any suitable material, for example, the fin structure 211 comprises a silicon fin (Si-fin). The fin structure 211 may include a capping layer disposed on the fins, which may be a silicon capping layer.

The fin structure 211 is formed by any suitable process including various deposition, photolithography, and/or etching processes. An exemplary photolithography process may include forming a photoresist layer (resist) overlying the substrate (e.g., on a silicon layer), exposing the resist to a pattern, performing a post-exposure bake process, and developing the resist to form a masking element including the resist. The masking element may then be used to etch the fin structure into the silicon layer. The fin structure may be etched using reactive ion etching (RIE) processes and/or other suitable processes. In one example, the silicon fin 211 is formed by patterning and etching a portion of the silicon substrate 210. In another example, silicon fins of the fin structure 211 may be formed by patterning and etching a silicon layer deposited overlying an insulator layer (for example, an upper silicon layer of a silicon-insulator-silicon stack of an SOI substrate). It is understood that multiple parallel fin structures may be formed in a similar manner. Alternatively, the fin structure 211 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Exemplary isolation regions 212 are formed on the substrate 210 to isolate various regions of the substrate 210. The isolation region 212 utilizes isolation technology, such as local oxidation of silicon (LOCOS) or shallow trench isolation (STI), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

At block 104, one or more gate structures are formed over the substrate 210, including over a portion of the fin structure 211. In the present embodiment, a gate structure 220 is formed over the substrate 210 including over a central portion of the fin structure 211. The gate structure 220 is formed by any suitable process. For example, the gate structure is formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

The gate structure 220 comprises a gate stack having an interfacial layer 222, a gate dielectric layer 224, a gate layer 226, and a hard mask layer 226. The gate stack is formed by any suitable process. In an example, a hard mask layer is formed over the gate layer; a patterned photoresist layer is formed on the hard mask layer; the pattern of the photoresist layer is transferred to the hard mask layer and then transferred to a gate layer, a gate dielectric layer, and an interfacial layer to form the gate stack of the gate structure 220. It is understood that the gate stack of the gate structure 220 may comprise additional layers. For example, the gate structure 220 may comprise interfacial layers, capping layers, diffusion/barrier layers, dielectric layers, conductive layers, other suitable layers, and/or combinations thereof.

The interfacial layer 222 is formed over the substrate 210 and fin structure 211. The interfacial layer 222 is formed by any suitable process to any suitable thickness. For example, the interfacial layer 222 includes a silicon oxide layer (e.g., thermal oxide or chemical oxide). Alternatively, the interfacial layer 222 comprises silicon oxynitride (SiON).

The gate dielectric layer 224 is formed over the interfacial layer 222 by any suitable process. The gate dielectric layer 224 comprises a dielectric material, such as silicon oxide, silicon nitride, silicon oxynitride, high-k dielectric material, other suitable dielectric material, and/or combinations thereof. Examples of high-k dielectric material includes $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The gate layer 226 (also referred to as a gate electrode) is formed over the gate dielectric layer 224 by any suitable process. The gate layer 226 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 228 is formed over the gate layer 226 by any suitable process. The hard mask layer 228 comprises any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

The gate structure 220 may further include spacer liner 229 and dummy gate spacers 230 as illustrated in FIG. 2A. The spacer liner 229 and dummy gate spacers 230 are formed by any suitable process to any suitable thickness. The spacer liner 229 may comprise an oxide material (e.g., silicon oxide), and the dummy gate spacers 230, which are positioned on each side of the gate stack (on the sidewalls of the gate stack), may comprise a nitride material (e.g., silicon nitride). In various examples, the dummy gate spacers 230 comprise a dielectric material, such as silicon nitride, silicon carbide, silicon oxynitride, other suitable materials, and/or combinations thereof. The dummy gate spacers 230 may be used to offset subsequently formed doped regions, such as source/drain regions. The dummy gate spacers 230 may further be used for designing or modifying the source/drain region (junction) profile. The gate structure 220 may further include a sealing layer and any other suitable feature.

Conventional processing continues by forming various doped regions in the fin structure 211. For example, various doped regions can comprise lightly doped source/drain (LDD) regions and source/drain (S/D) regions (also referred to as heavily doped S/D regions). It has been observed that implantation processes, such as ion implantation processes, can damage the substrate 210 (including the fin structure 211) and subject the substrate 210 (including the fin structure 211) to amorphorization effects. More particularly, implantation processes can induce damage to the silicon-containing fin structure (Si-fins), which degrades device performance. As device scaling (e.g., fin width scaling) continues, implantation damage and amorphorization effects become more serious, further impacting device performance.

Figure 2B:
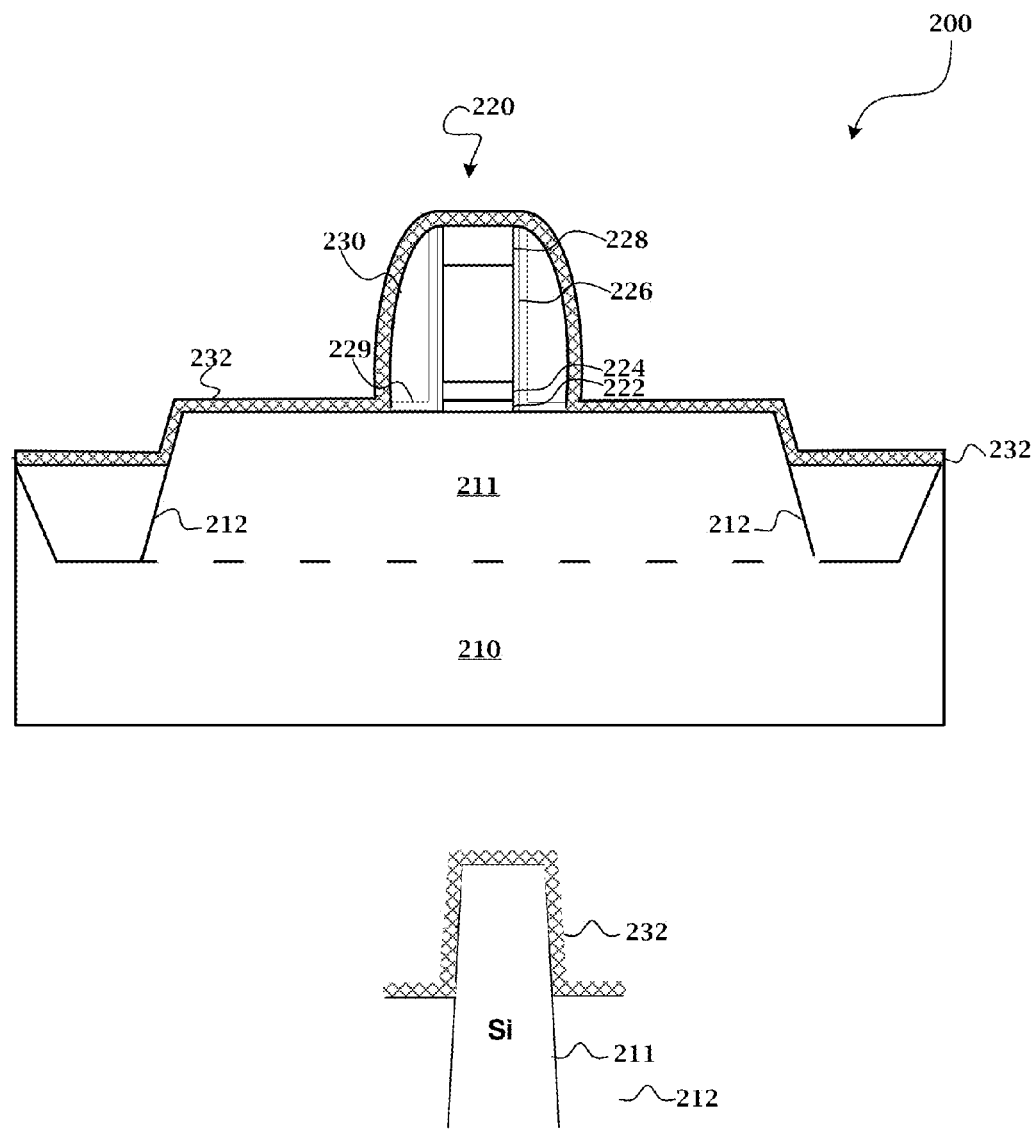
Figure 2C:
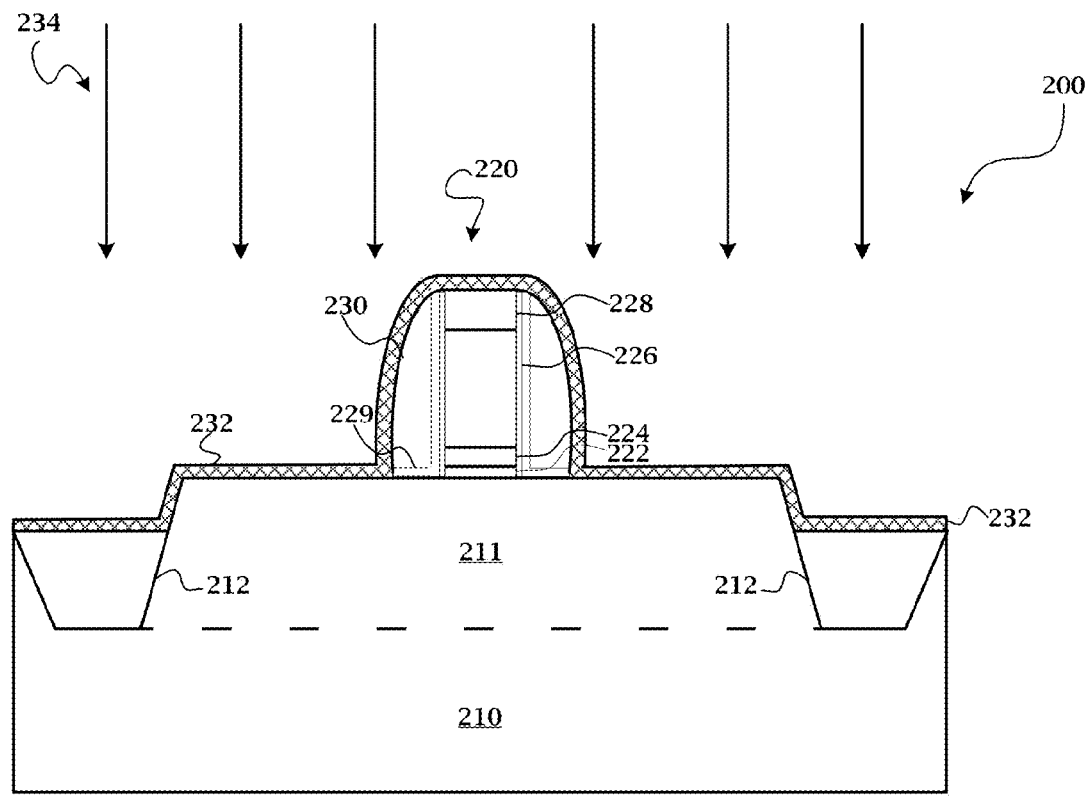
Figure 2C:
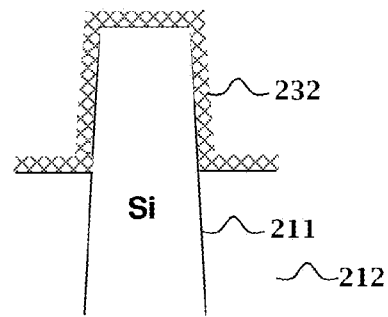

Accordingly, at block 106, a first protection layer is formed over the substrate as illustrated in FIG. 2B. For example, the first protection layer 232 is formed over the substrate 210, fin structure 211, and gate structure 220. The first protection layer 232 may alternatively be referred to as a sacrificial-offset-protection (SOP) layer because, as will be further discussed below, the protection layer 232 serves as (1) a sacrificial layer during surface cleaning and/or material layer stripping processes, (2) an offset for designing junction profile (i.e., a junction design reference), and/or (3) a protection against ion implantation related crystal damage. It is understood that different embodiments may have different advantages, and that no particular advantage is necessarily required of any embodiment. The first protection layer 232 is formed by any suitable process to any suitable thickness. The first protection layer 232 comprises any suitable material, for example, an oxide and/or a nitride material, such as silicon oxynitride. An exemplary first protection layer 232 comprises a low-k dielectric material At block 108, a first implantation process 234 (i.e., a junction implant) is performed to form S/D regions as illustrated in FIG. 2C. As noted above, the first protection layer 232 can act as an offset for designing junction profile. Thus, the thickness of the first protection layer 232 may be varied to design a junction profile (i.e., the thickness is varied to control a junction depth resulting from the implantation process). The first protection layer 232 can also suppress (or eliminate) damage to the substrate 210, fin structure 211, and/or gate structure 220 during the first implantation process 234.

The first implantation process 234 utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may comprise various doping profiles. One or more annealing processes may be performed to activate the S/D regions. The annealing processes comprise rapid thermal annealing (RTA) and/or laser annealing processes.

Figure 2D:
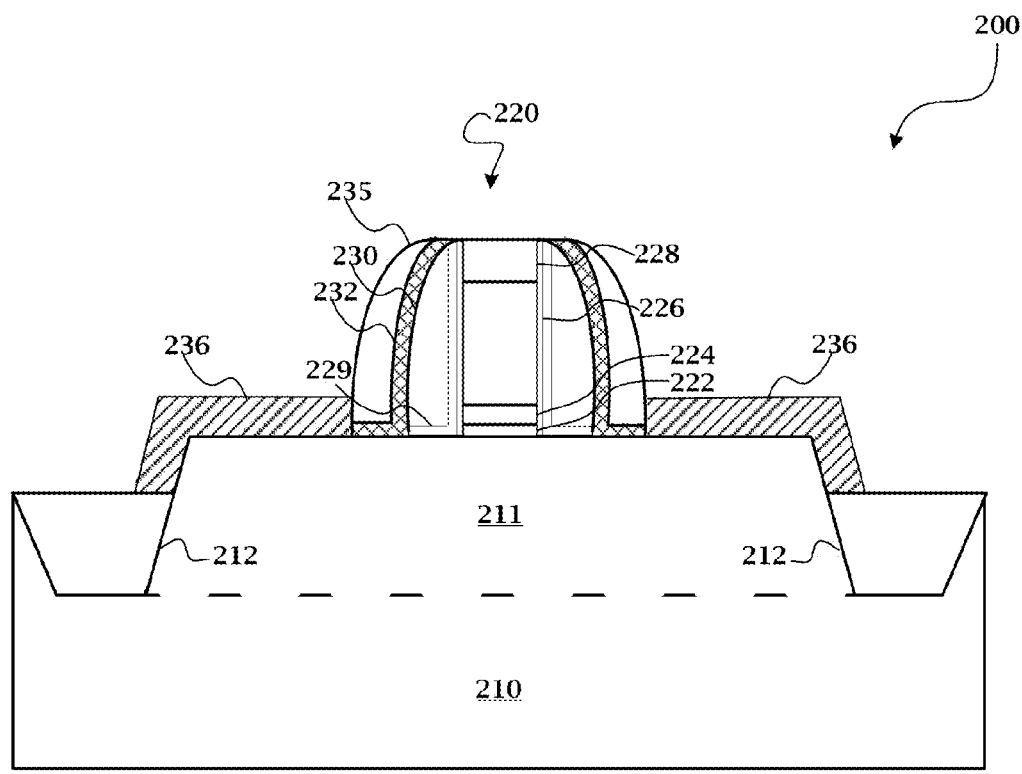
Figure 2D:
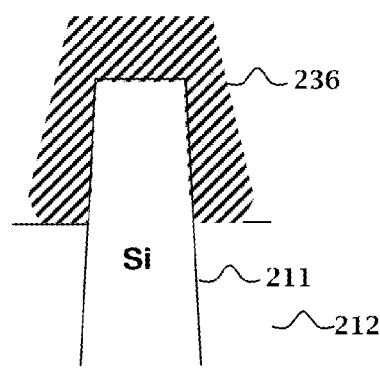

In the present embodiment, after the first implantation process 234, the first protection layer 232 is etched to form a spacer liner as illustrated in FIG. 2D. A surface cleaning process may subsequently be performed to clean the surface for a source/drain epitaxial growth process. Alternatively, a surface cleaning process may be performed, where the first protection layer 232 acts as a sacrificial layer during the surface cleaning process. For example, the first protection layer 232 may be removed during the cleaning process without the substrate 210, fin structure 211, and/or gate structure 220 being affected by the cleaning process. For any process performed on the first protection layer 232, the process exhibits an etching selectivity for the first protection layer 232 as compared to the substrate 210 and/or fin structure 211 (which in the present embodiment comprises silicon).

Main spacers 235 may then be formed over the dummy gate spacers 230, and in the present embodiment, over the etched first protection layer 232 (acting as a spacer liner). The main spacers 235 are formed by any suitable process to any suitable thickness. The main spacers 235 comprise a dielectric material, such as silicon nitride, silicon carbide, silicon oxynitride, other suitable materials, and/or combinations thereof. The main spacers 235 may be used to offset subsequently formed doped regions, such as raised source/drain regions.

Referring to FIGS. 1 and 2D, at block 110, raised source/drain (S/D) regions 236 are formed over the S/D regions of the fin structure 211. The raised S/D regions 236 may be formed by one or more epitaxy processes, such that Si features, SiGe features, and/or other suitable features can be formed in a crystalline state on the fin structure 211. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 211 (e.g., silicon). Thus, a strained channel may be achieved to increase carrier mobility and enhance device performance. The raised S/D regions 236 may be in-situ doped. The doping species may include p-type dopants, such as boron or $BF_2$; n-type dopants, such as phosphorus or arsenic; and/or combinations thereof.

Figure 2E:
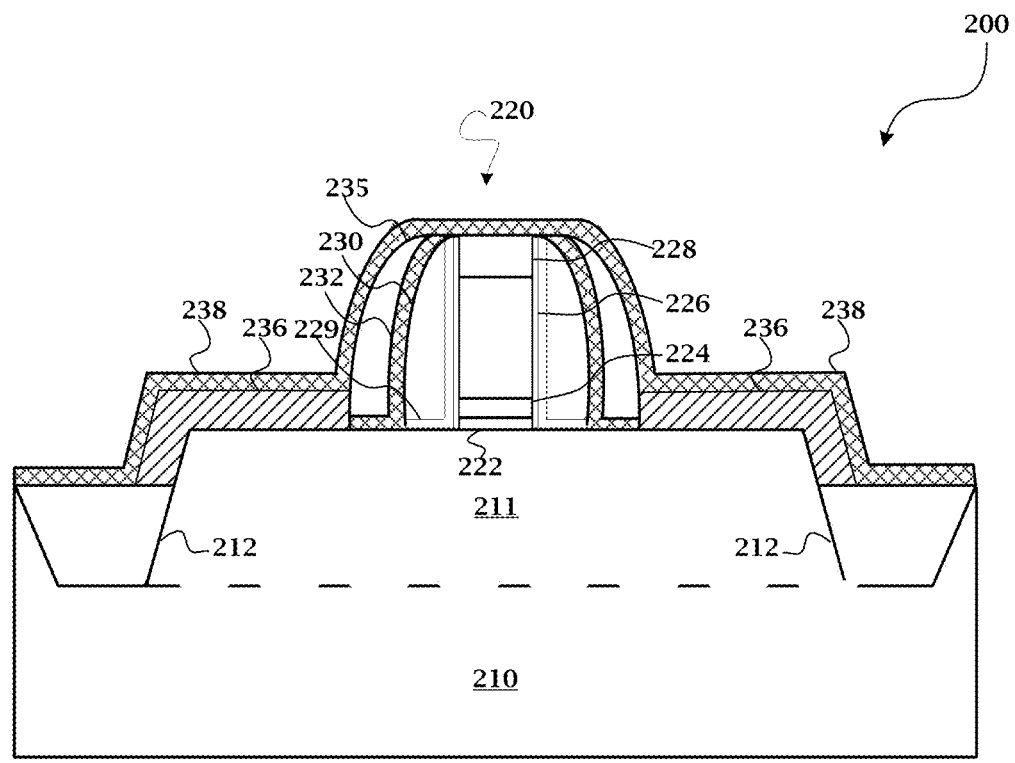
Figure 2E:
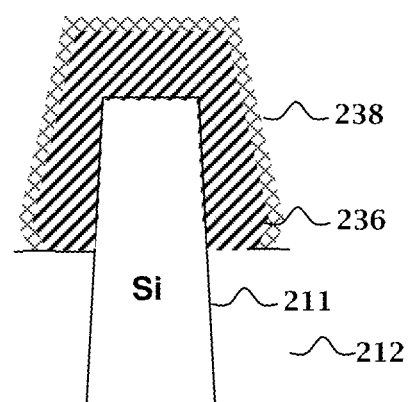
Figure 2F:
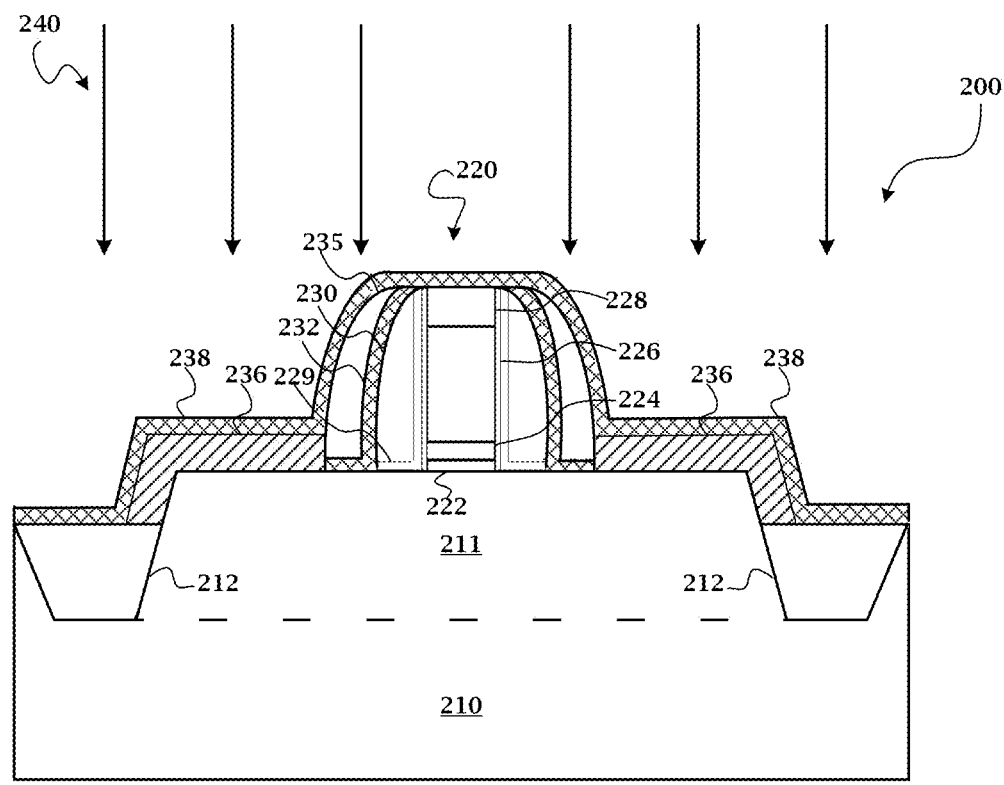
Figure 2F:
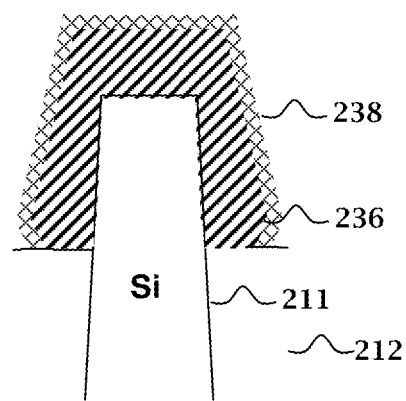

As illustrated in FIG. 2E, if the raised S/D regions are not in-situ doped, at block 112, a second protection layer 238 is formed over the substrate by any suitable process to any suitable thickness. For example, the second protection layer 238 is formed over the substrate 210, fin structure 211, and gate structure 220. The second protection layer 238 may be similar to the first protection layer 234. For example, the second protection layer 238 may perform one or more functions of a SOP layer, such as serving as a sacrificial layer during surface cleaning and/or material layer stripping processes, an offset for designing junction profile (i.e., a junction design reference), and/or a protection against ion implantation related crystal damage. The second protection layer 238 comprises any suitable material, for example, an oxide and/or a nitride material, such as silicon oxynitride. An exemplary second protection layer 238 comprises a low-k dielectric material.

Then, at block 114, a second implantation process 240 (i.e., a junction implant process) is performed to dope the raised S/D regions 236. The second implantation process 240 is performed through the second protection layer 238, which can act as an offset for designing junction profile. Thus, the thickness of the second protection layer 238 may be varied to design a junction profile (i.e., the thickness is varied to control a junction depth). The second protection layer 238 can also suppress (or eliminate) damage to the substrate 210, fin structure 211, and/or gate structure 220 during the second implantation process 240.

The second implantation process 240 utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may comprise various doping profiles. One or more annealing processes may be performed to activate the S/D regions. The annealing processes comprise rapid thermal annealing (RTA) and/or laser annealing processes.

Subsequently, the semiconductor device 200 may undergo further CMOS or MOS technology processing to form various features known in the art. For example, subsequently, a cleaning process may be performed to prepare the surface for S/D contact formation (e.g., S/D silicide formation). The second protection layer 238 may act as a sacrificial layer during the surface cleaning process, such that the second protection layer 238 may be removed during the cleaning process without the substrate 210, fin structure 211 (including raised S/D regions 236), and/or gate structure 220 being affected by the cleaning process. Similarly to the first protection layer 232, for any process performed on the second protection layer 238, the process exhibits an etching selectivity for the second protection layer 238 as compared to the substrate 210 and/or fin structure 211 (which in the present embodiment comprises silicon).

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device including the formed gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 3:
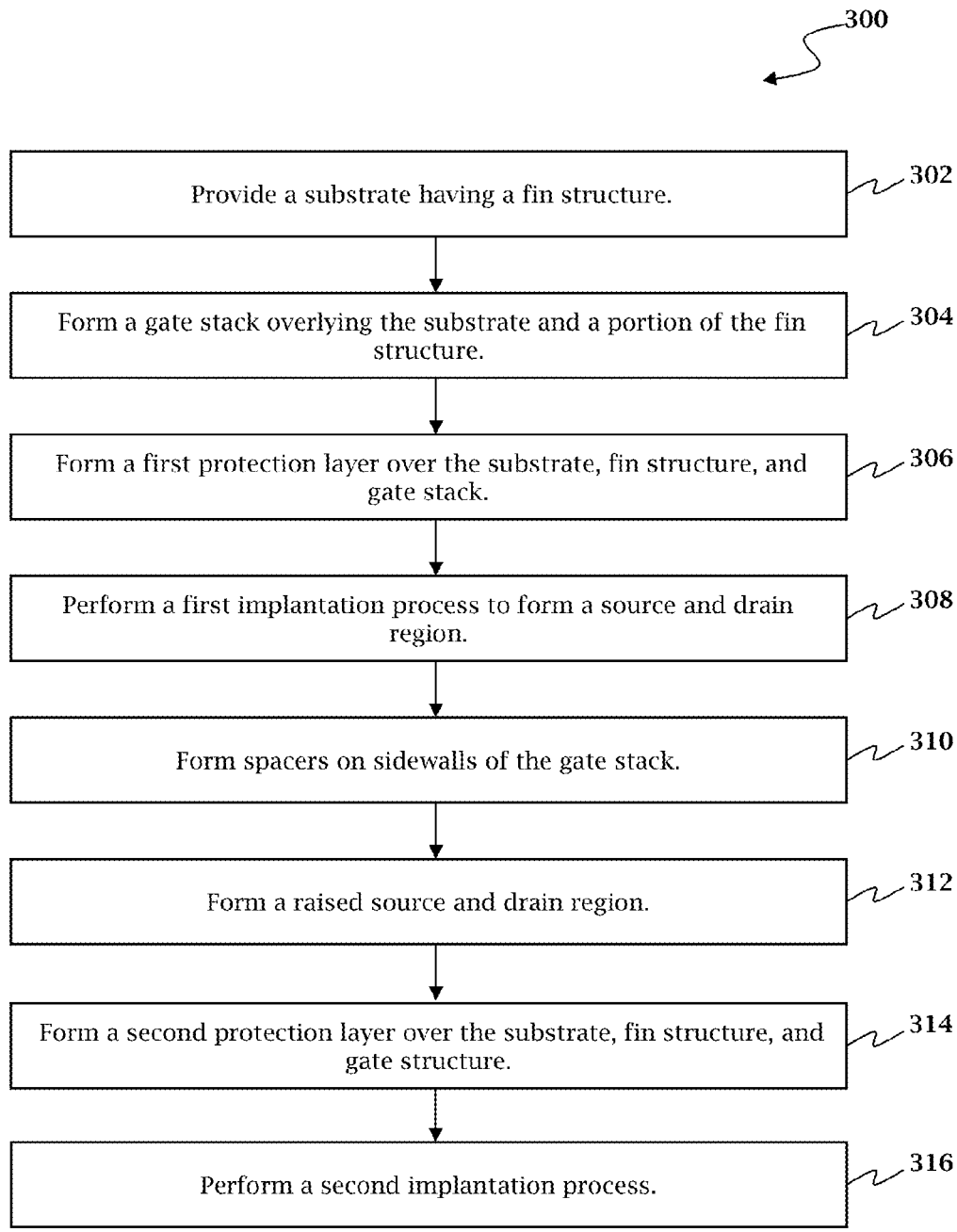
FIG. 3 is a flow chart of a method for fabricating an integrated circuit device according to aspects of the present disclosure.
Figure 4A:
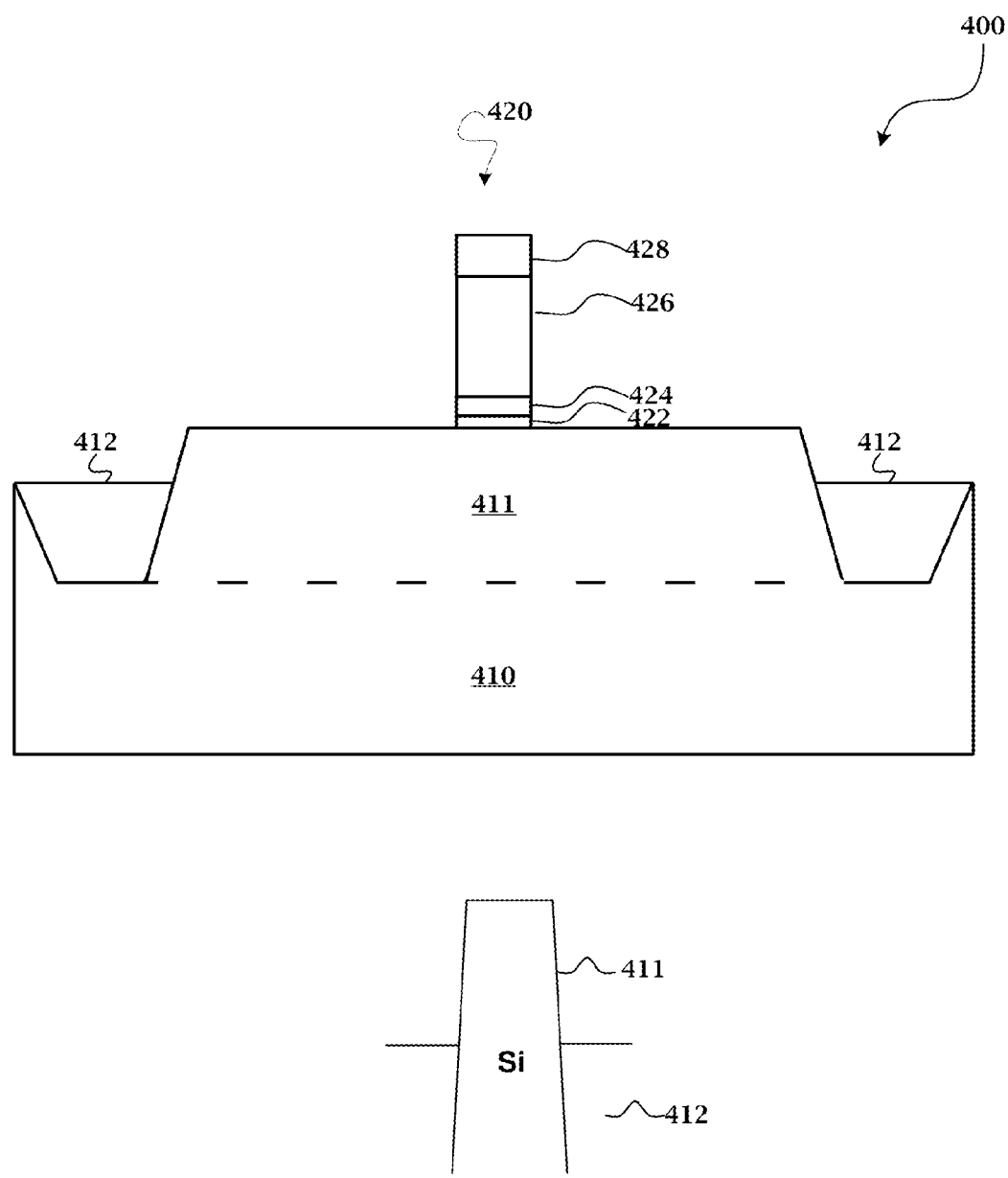
FIGS. 4A-4F are various cross-sectional views of embodiments of an integrated circuit device during various fabrication stages according to the method of FIG. 3.

FIG. 3 illustrates a flow chart of an embodiment of the method 300 to fabricate the FinFET device 400. Referring to FIGS. 3 and 4A, at block 302, a substrate (wafer) 410 is provided having a fin structure 411. The substrate 410 comprises silicon in a crystalline structure. The substrate 410 comprises any suitable crystallographic orientation (e.g., a (100), (110), (111), or (001) crystallographic orientation). Alternatively, the substrate 410 comprises other suitable elementary semiconductors, such as germanium in crystal; a compound semiconductor, such as silicon carbide, gallium arsenic, gallium phosphide, indium phosphide, indium arsenide, and/or indium antimonide; or combinations thereof. Alternatively, the substrate 410 includes a silicon-on-insulator (SOI) substrate, which can be fabricated using separation by implantation of oxygen (SIMOX), wafer bonding, and/or other suitable methods.

The substrate 410 may also include an insulator layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET devices 400, the insulator layer is a component (e.g., layer) of a silicon-on-insulator substrate.

The substrate 410 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 410, in a P-well structure, in a N-well structure, in a dual-well structure, or using a raised structure. The semiconductor substrate 410 may further include various active regions, such as regions configured for an N-type metal-oxide-semiconductor transistor device and regions configured for a P-type metal-oxide-semiconductor transistor device.

The fin structure 411, formed over the substrate 410, comprises one or more fins. In the present embodiment, for simplicity, the fin structure 411 illustrates a single fin. The fins comprise any suitable material, for example, the fin structure 411 comprises a silicon fin (Si-fin). The fin structure 411 may include a capping layer disposed on the fins, which may be a silicon capping layer.

The fin structure 411 is formed by any suitable process including various deposition, photolithography, and/or etching processes. An exemplary photolithography process may include forming a photoresist layer (resist) overlying the substrate (e.g., on a silicon layer), exposing the resist to a pattern, performing a post-exposure bake process, and developing the resist to form a masking element including the resist. The masking element may then be used to etch the fin structure into the silicon layer. The fin structure may be etched using reactive ion etching (RIE) processes and/or other suitable processes. In an example, the silicon fin 411 is formed by patterning and etching a portion of the silicon substrate 410. In another example, silicon fins of the fin structure 411 may be formed by patterning and etching a silicon layer deposited overlying an insulator layer (for example, an upper silicon layer of a silicon-insulator-silicon stack of an SOI substrate). It is understood that multiple parallel fin structures may be formed in a similar manner. Alternatively, the fin structure 411 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Exemplary isolation regions 412 are formed on the substrate 410 to isolate various regions of the substrate 410. The isolation region 412 utilizes isolation technology, such as local oxidation of silicon (LOCOS) or shallow trench isolation (STI), to define and electrically isolate the various regions. In the present embodiment, the isolation region 412 includes a STI. The isolation region 412 comprises silicon oxide, silicon nitride, silicon oxynitride, other suitable materials, or combinations thereof. The isolation region 412 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

At block 304, one or more gate structures are formed over the substrate 410, including over a portion of the fin structure 411. In the present embodiment, a gate structure 420 is formed over the substrate 410 including over a central portion of the fin structure 411. The gate structure 420 is formed by any suitable process. For example, the gate structure is formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

The gate structure 420 comprises a gate stack having an interfacial layer 422, a gate dielectric layer 424, a gate layer 426, and a hard mask layer 428. The gate stack is formed by any suitable process. In an example, a hard mask layer is formed over a gate layer; a patterned photoresist layer is formed on the hard mask layer; the pattern of the photoresist layer is transferred to the hard mask layer and then transferred to the gate layer, a gate dielectric layer, and an interfacial layer to form the gate stack of the gate structure 420. It is understood that the gate stack of the gate structure 420 may comprise additional layers. For example, the gate structure 420 may comprise interfacial layers, capping layers, diffusion/barrier layers, dielectric layers, conductive layers, other suitable layers, and/or combinations thereof.

The interfacial layer 422 is formed over the substrate 410 and fin structure 411. The interfacial layer 422 is formed by any suitable process to any suitable thickness. For example, the interfacial layer 422 includes a silicon oxide layer (e.g., thermal oxide or chemical oxide). Alternatively, the interfacial layer 422 comprises silicon oxynitride (SiON).

The gate dielectric layer 424 is formed over the interfacial layer 422 by any suitable process. The gate dielectric layer 424 comprises a dielectric material, such as silicon oxide, silicon nitride, silicon oxynitride, high-k dielectric material, other suitable dielectric material, and/or combinations thereof. Examples of high-k dielectric material includes $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The gate layer 426 (also referred to as a gate electrode) is formed over the gate dielectric layer 424 by any suitable process. The gate layer 426 includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 428 is formed over the gate layer 426 by any suitable process. The hard mask layer 428 comprises any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

Figure 4B:
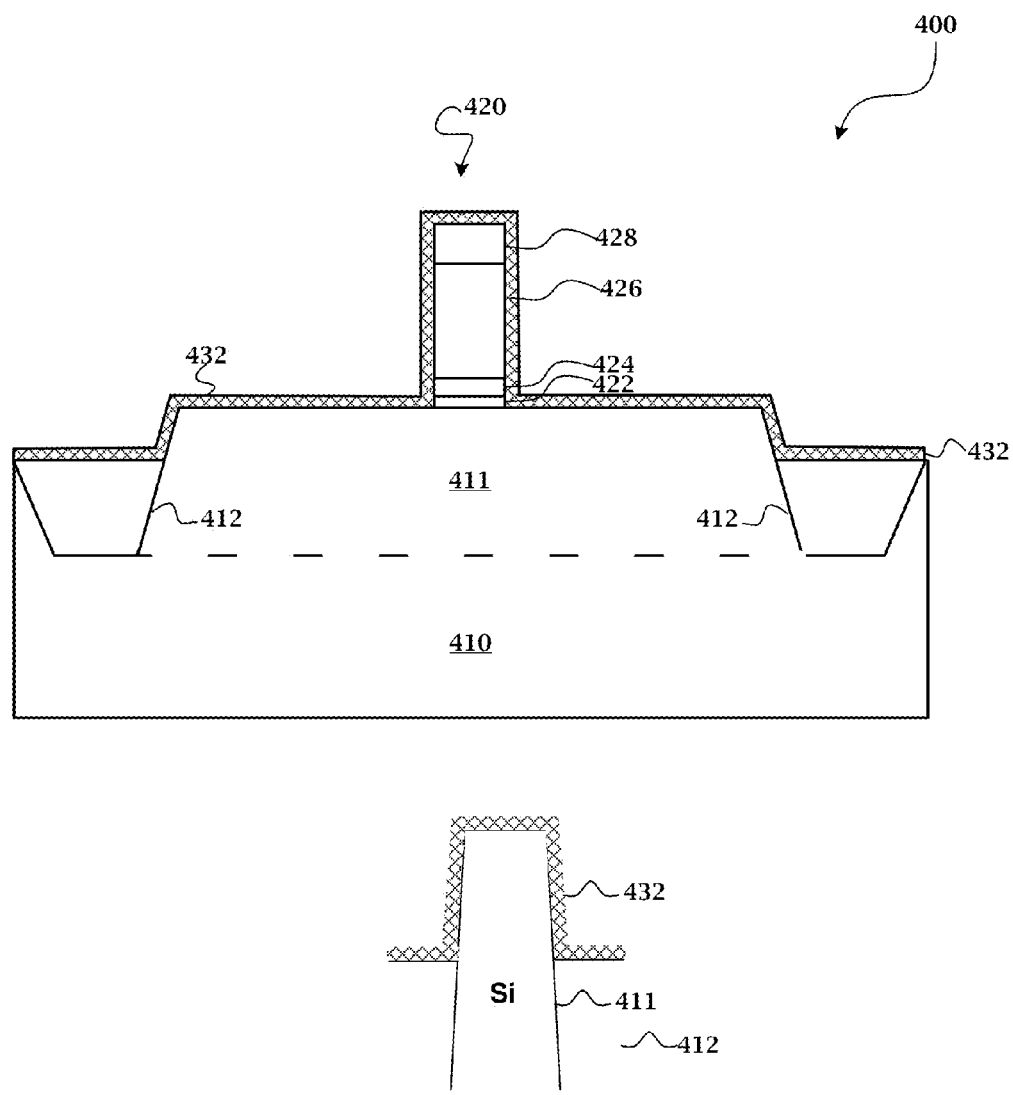

At block 306, a first protection layer is formed over the substrate as illustrated in FIG. 4B. For example, the first protection layer 432 is formed over the substrate 410, fin structure 411, and gate structure 420. The first protection layer 432 may alternatively be referred to as a sacrificial-offset-protection (SOP) layer because, as will be further discussed below, the protection layer 432 serves as (1) a sacrificial layer during surface cleaning and/or material layer stripping processes, (2) an offset for designing junction profile (i.e., a junction design reference), and/or (3) a protection against ion implantation related crystal damage. It is understood that different embodiments may have different advantages, and that no particular advantage is necessarily required of any embodiment. The first protection layer 432 is formed by any suitable process to any suitable thickness. The first protection layer 432 comprises any suitable material, for example, an oxide and/or a nitride material, such as silicon oxynitride. An exemplary first protection layer 432 comprises a low-k dielectric material.

Figure 4C:
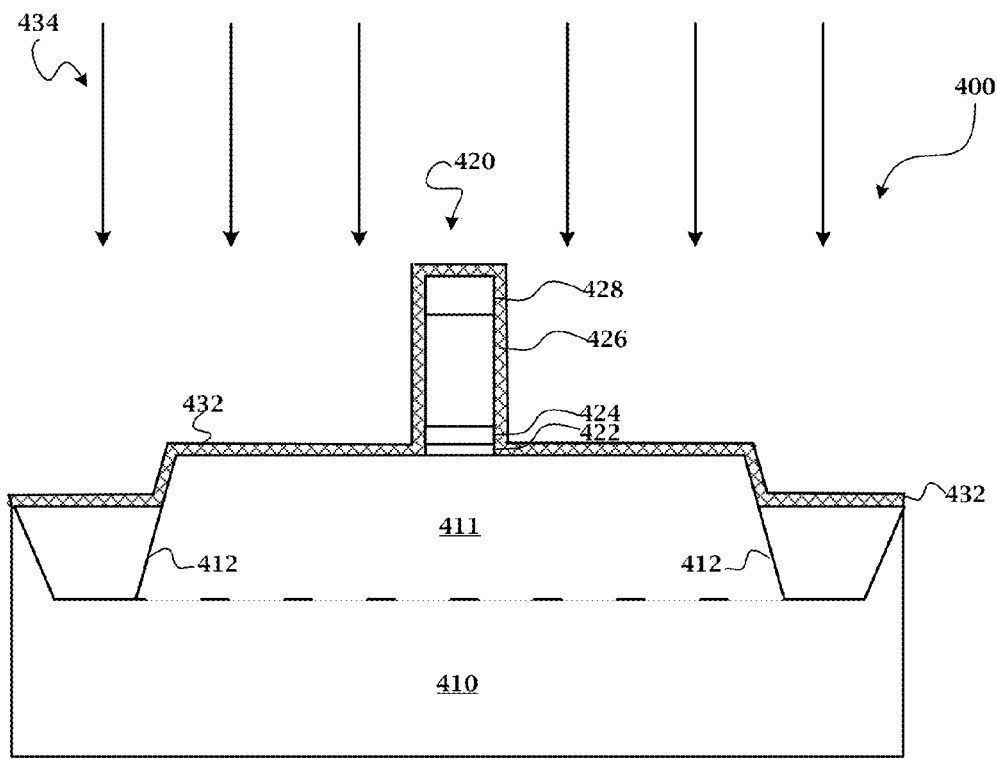
Figure 4C:
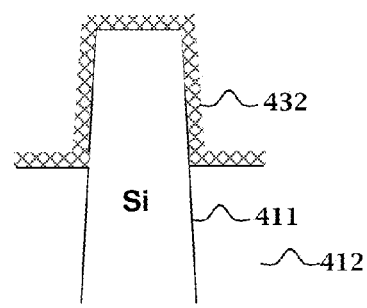

At block 308, a first implantation process 434 (i.e., a junction implant) is performed to form S/D regions as illustrated in FIG. 4C. As noted above, the first protection layer 432 can act as an offset for designing junction profile. Thus, the thickness of the first protection layer 432 may be varied to design a junction profile (i.e., the thickness is varied to control a junction depth resulting from the implantation process). The first protection layer 432 can also suppress (or eliminate)

damage to the substrate 410, fin structure 411, and/or gate structure 420 during the first implantation process 434.

The first implantation process 434 utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may comprise various doping profiles. One or more annealing processes may be performed to activate the S/D regions. The annealing processes comprise rapid thermal annealing (RTA) and/or laser annealing processes.

Figure 4D:
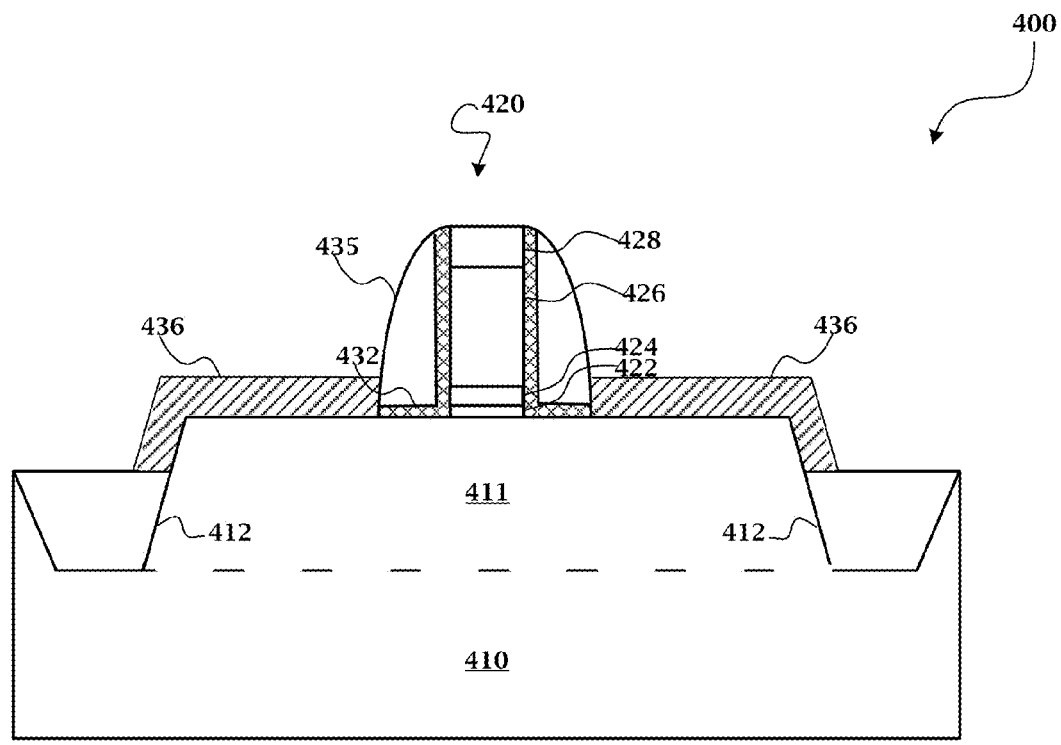
Figure 4D:
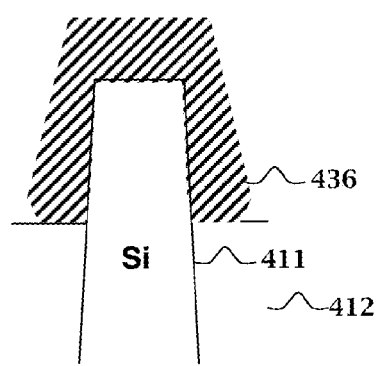

In the present embodiment, after the first implantation process 434, the first protection layer 432 is etched to form a spacer liner as illustrated in FIG. 4D. A surface cleaning process may subsequently be performed to clean the surface for a source/drain epitaxial growth process. Alternatively, a surface cleaning process may be performed, where the first protection layer 432 acts as a sacrificial layer during the surface cleaning process. For example, the first protection layer 432 may be removed during the cleaning process without the substrate 410, fin structure 411, and/or gate structure 420 being affected by the cleaning process. For any process performed on the first protection layer 432, the process exhibits an etching selectivity for the first protection layer 432 as compared to the substrate 410 and/or fin structure 411 (which in the present embodiment comprises silicon).

At block 310, spacers are formed on the sidewalls of the gate stack. For example, main spacers 435 are formed on the sidewalls of the gate stack (including interfacial layer 422, gate dielectric layer 424, gate layer 426, and hard mask layer 428), and in the present embodiment, over the etched first protection layer 432 (acting as a spacer liner). The main spacers 435 are formed by any suitable process to any suitable thickness. The main spacers 435 comprise a dielectric material, such as silicon nitride, silicon carbide, silicon oxynitride, other suitable materials, and/or combinations thereof. The main spacers 435 may be used to offset subsequently formed doped regions, such as raised source/drain regions.

Referring to FIGS. 1 and 4D, at block 312, raised source/drain (S/D) regions 436 are formed over the S/D regions of the fin structure 411. The raised S/D regions 436 may be formed by one or more epitaxy processes, such that Si features, SiGe features, and/or other suitable features can be formed in a crystalline state on the fin structure 411. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 411 (e.g., silicon). Thus, a strained channel may be achieved to increase carrier mobility and enhance device performance. The raised S/D regions 436 may be in-situ doped. The doping species may include p-type dopants, such as boron or $BF_2$; n-type dopants, such as phosphorus or arsenic; and/or combinations thereof.

Figure 4E:
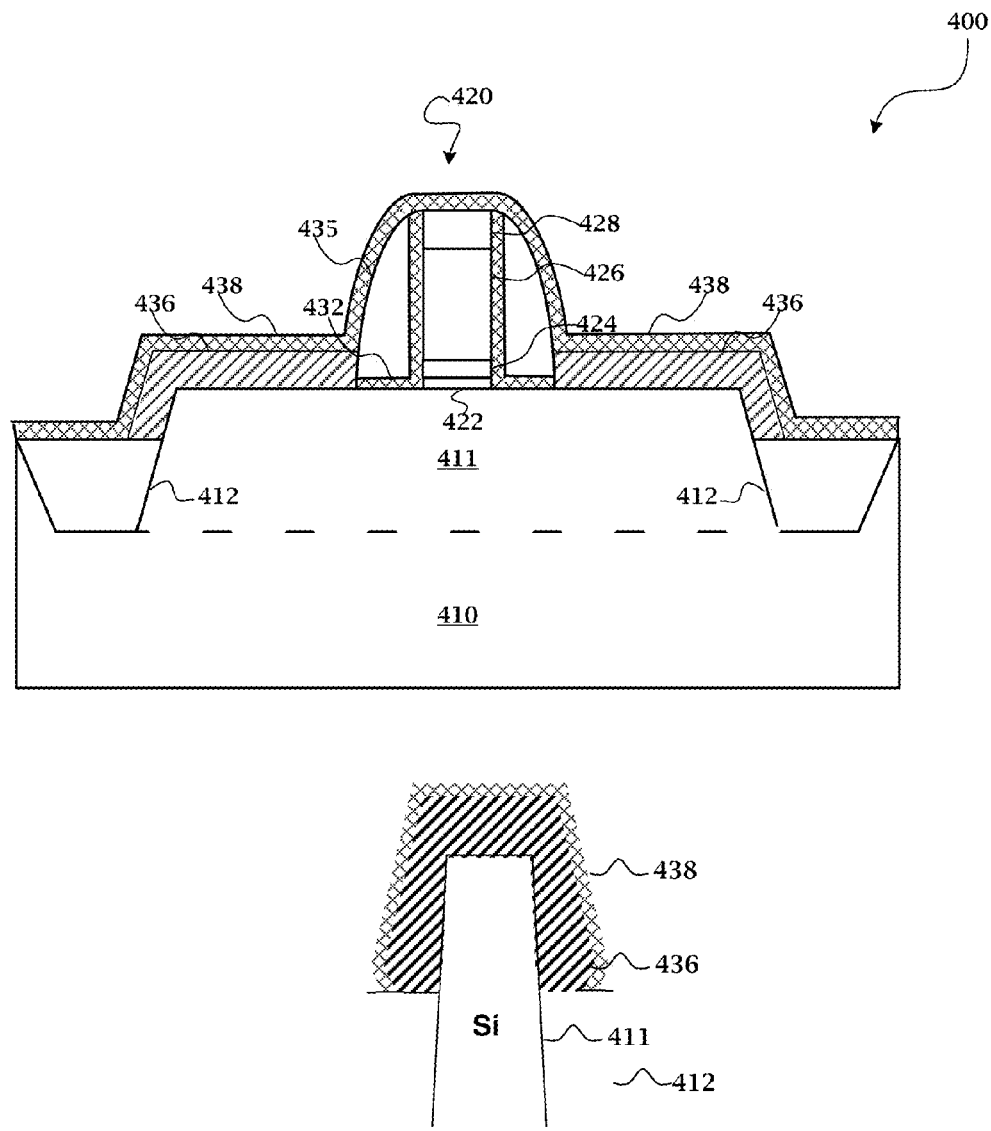
Figure 4F:
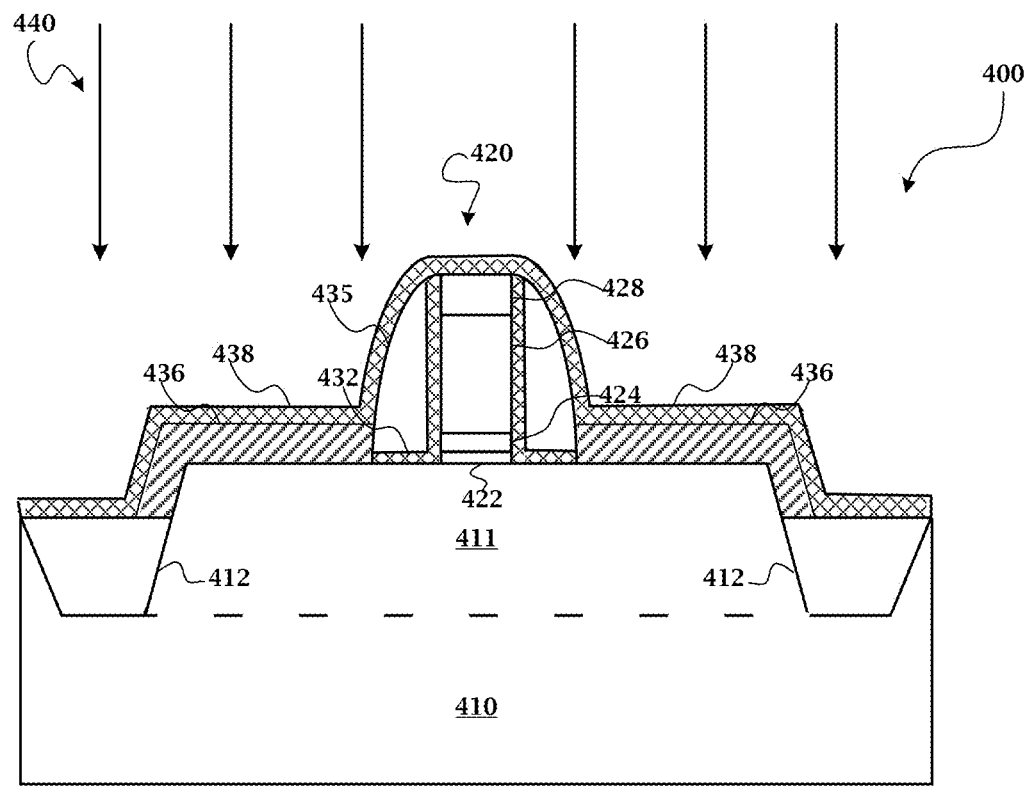
Figure 4F:
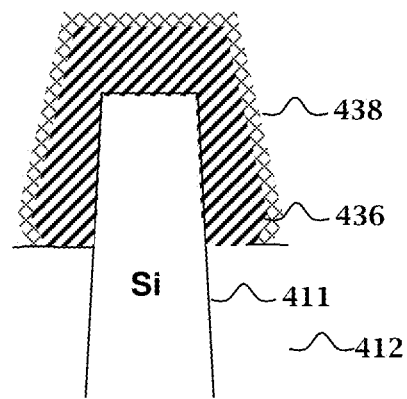

As illustrated in FIG. 4E, if the raised S/D regions are not in-situ doped, at block 314, a second protection layer 438 is formed over the substrate by any suitable process to any suitable thickness. For example, the second protection layer 438 is formed over the substrate 410, fin structure 411, and gate structure 420. The second protection layer 438 may be similar to the first protection layer 434. For example, the second protection layer 438 may perform one or more functions of a SOP layer, such as serving as a sacrificial layer during surface cleaning and/or material layer stripping processes, an offset for designing junction profile (i.e., a junction design reference), and/or a protection against ion implantation related crystal damage. The second protection layer 438 comprises any suitable material, for example, an oxide and/or a nitride material, such as silicon oxynitride. An exemplary second protection layer 438 comprises a low-k dielectric material.

At block 316, a second implantation process 440 (i.e., a junction implant process) is then performed to dope the raised S/D regions 436. The second implantation process 440 is performed through the second protection layer 438, which can act as an offset for designing junction profile. Thus, the thickness of the second protection layer 438 may be varied to design a junction profile (i.e., the thickness is varied to control a junction depth). The second protection layer 438 can also suppress (or eliminate) damage to the substrate 410, fin structure 411, and/or gate structure 420 during the second implantation process 440.

The second implantation process 440 utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may comprise various doping profiles. One or more annealing processes may be performed to activate the S/D regions. The annealing processes comprise rapid thermal annealing (RTA) and/or laser annealing processes.

Subsequently, the semiconductor device 400 may undergo further CMOS or MOS technology processing to form various features known in the art. For example, subsequently, a cleaning process may be performed to prepare the surface for S/D contact formation (e.g., S/D silicide formation). The second protection layer 438 may act as a sacrificial layer during the surface cleaning process, such that the second protection layer 438 may be removed during the cleaning process without the substrate 410, fin structure 411 (including raised S/D regions 436), and/or gate structure 420 being affected by the cleaning process. Similarly to the first protection layer 432, for any process performed on the second protection layer 438, the process exhibits an etching selectivity for the second protection layer 438 as compared to the substrate 410 and/or fin structure 411 (which in the present embodiment comprises silicon).

Subsequent processing may form various contacts/vias/lines and multilayer interconnect features (e.g., metal layers and interlayer dielectrics) on the substrate 410, configured to connect the various features or structures of the semiconductor device 400. The additional features may provide electrical interconnection to the device including the formed gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 5:
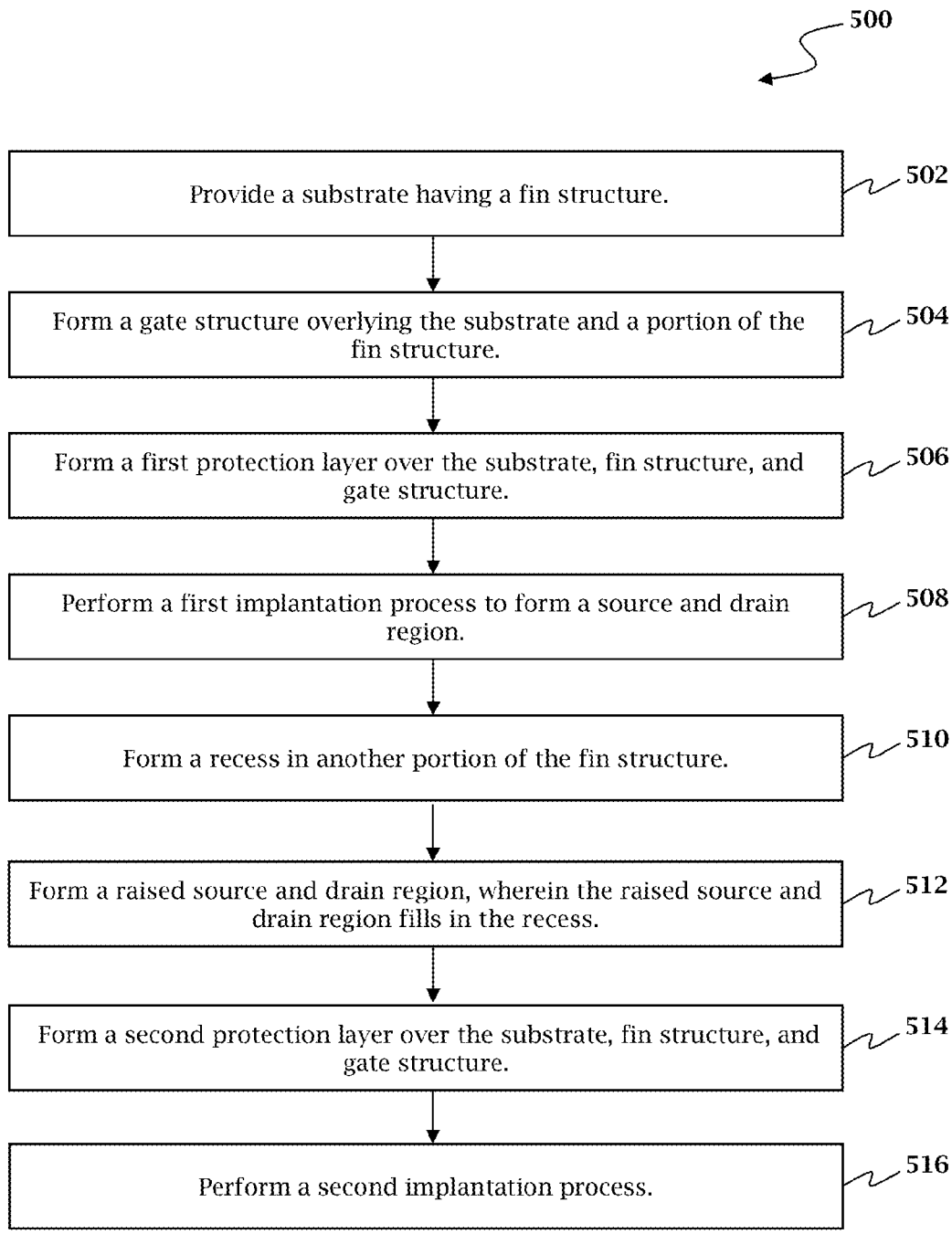
FIG. 5 is a flow chart of a method for fabricating an integrated circuit device according to aspects of the present disclosure.
Figure 6A:
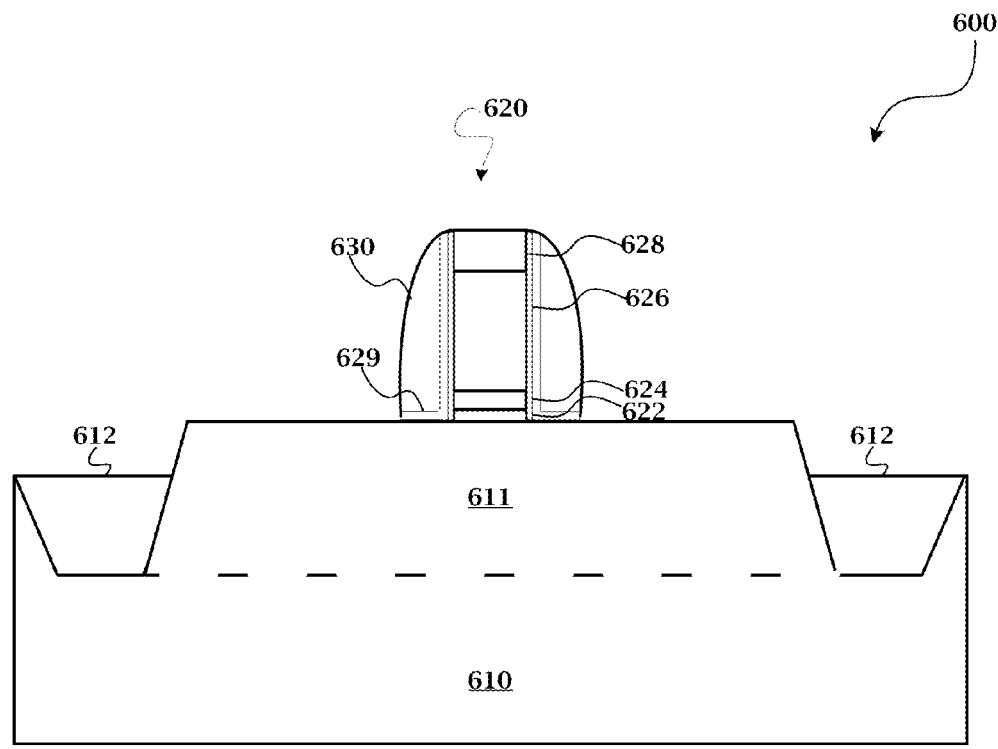
FIGS. 6A-6F are various cross-sectional views of embodiments of an integrated circuit device during various fabrication stages according to the method of FIG. 5.
Figure 6A:
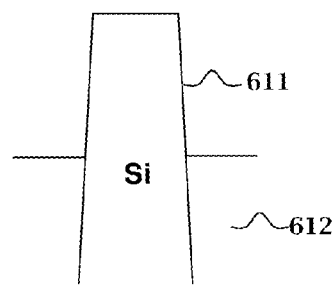

FIG. 5 illustrates a flow chart of an embodiment of the method 500 to fabricate the FinFET device 600. FIGS. 6A-6F are various cross-sectional views of embodiments of the FinFET device 600 during various fabrication stages according to the method 500. The method 500 is similar to method 100 described above. Referring to FIGS. 5 and 6A, similarly to method 100, at block 502, a substrate 610 is provided having a fin structure 611. The substrate 610 also includes exemplary isolation regions 612. At block 504, a gate structure 620 is formed overlying the substrate 610 and a portion of the fin structure 611. The gate structure 620 comprises a gate stack (including an interfacial layer 622, a gate dielectric layer 624, a gate layer 626, a hard mask layer 628), spacer liner 629, and dummy gate spacers 630. The substrate 610, fin structure 611, isolation region 612, gate structure 620, interfacial layer 622, gate dielectric layer 624, gate layer 626, hard mask layer 628, spacer liner 629, and dummy gate spacers 630 may be similar to the substrate 210, fin structure 211, isolation region 212, gate structure 220, interfacial layer 222, gate dielectric layer 224, gate layer 226, hard mask layer 228, spacer liner 229, and dummy gate spacers 230 as illustrated and described with reference to FIGS. 2A-2F.

Figure 6B:
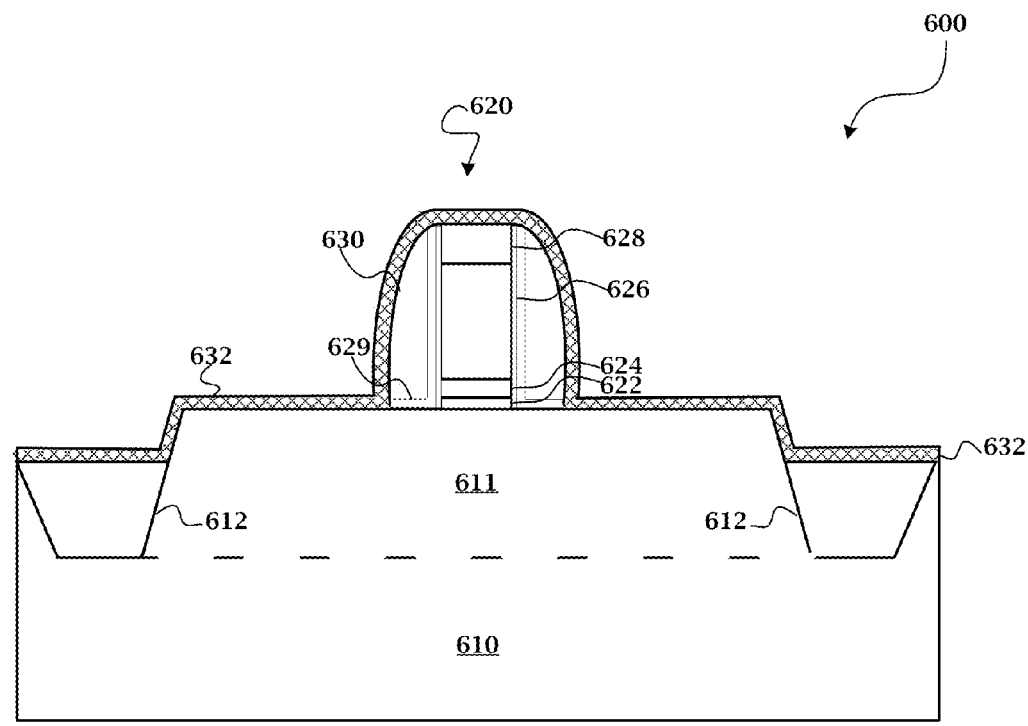
Figure 6B:
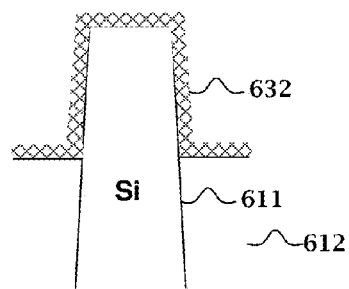

At block 506, a first protection layer is formed over the substrate as illustrated in FIG. 6B. For example, the first protection layer 632 is formed over the substrate 610, fin structure 611, and gate structure 620. The first protection layer 632 may alternatively be referred to as a sacrificial-offset-protection (SOP) layer because, as will be further discussed below, the protection layer 632 serves as (1) a sacrificial layer during surface cleaning and/or material layer stripping processes, (2) an offset for designing junction profile (i.e., a junction design reference), and/or (3) a protection against ion implantation related crystal damage. It is understood that different embodiments may have different advantages, and that no particular advantage is necessarily required of any embodiment. The first protection layer 632 may be similar to first protection layer 232 and is formed by any suitable process to any suitable thickness. The first protection layer 632 comprises any suitable material, for example, an oxide and/or a nitride material, such as silicon oxynitride. An exemplary first protection layer 632 comprises a low-k dielectric material.

Figure 6C:
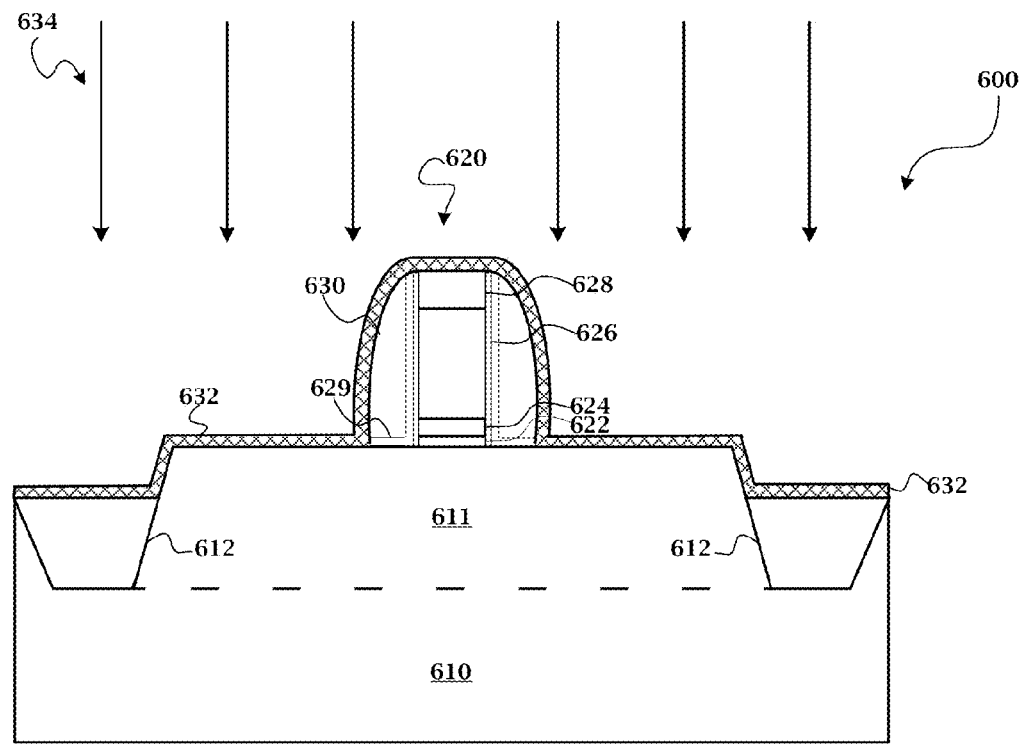
Figure 6C:
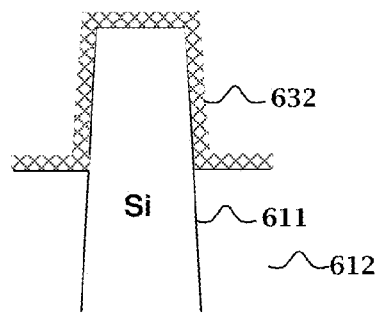

At block 508, a first implantation process 634 (i.e., a junction implant) is performed to form S/D regions as illustrated in FIG. 6C. As noted above, the first protection layer 632 can act as an offset for designing junction profile. Thus, the thickness of the first protection layer 632 may be varied to design a junction profile (i.e., the thickness is varied to control a junction depth). The first protection layer 632 can also suppress (or eliminate) damage to the substrate 610, fin structure 611, and/or gate structure 620 during the first implantation process 634.

Figure 6D:
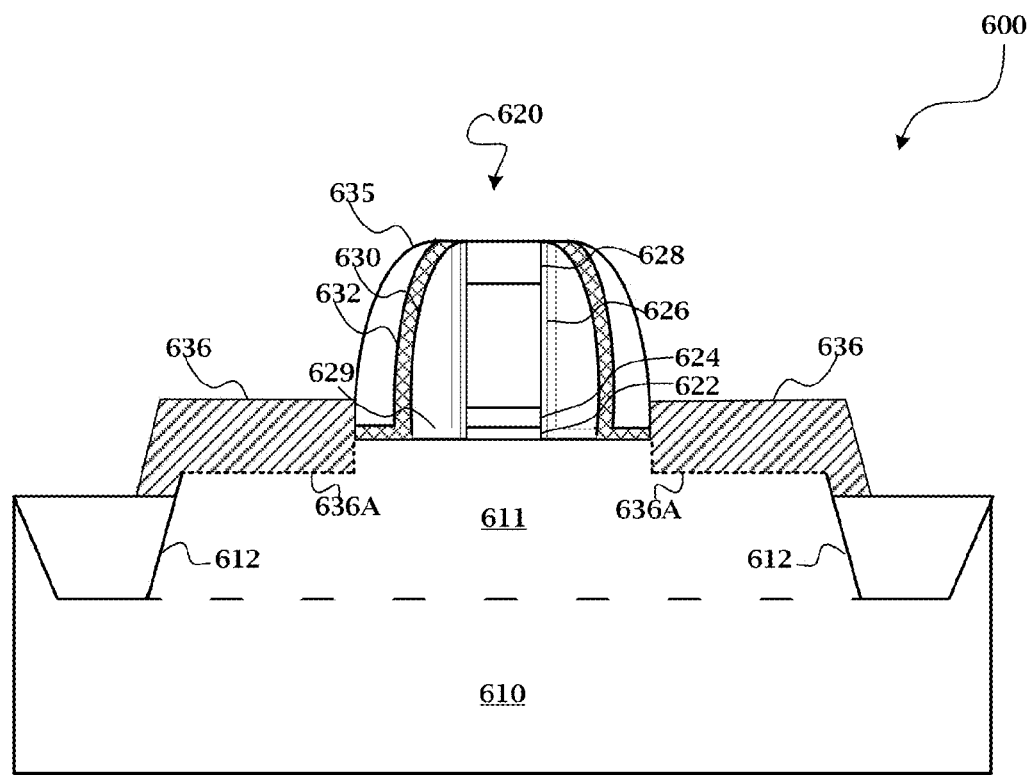
Figure 6D:
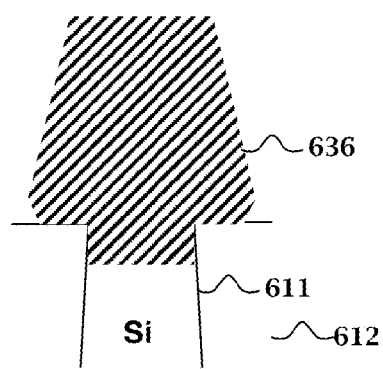

In the present embodiment, after the first implantation process 634, the first protection layer 632 is etched to form a spacer liner as illustrated in FIG. 6D. A surface cleaning process may subsequently be performed to clean the surface for a source/drain epitaxial growth process. Alternatively, a surface cleaning process may be performed, where the first protection layer 632 acts as a sacrificial layer during the surface cleaning process. For example, the first protection layer 632 may be removed during the cleaning process without the substrate 610, fin structure 611, and/or gate structure 620 being affected by the cleaning process. For any process performed on the first protection layer 632, the process exhibits an etching selectivity for the first protection layer 632 as compared to the substrate 610 and/or fin structure 611 (which in the present embodiment comprises silicon). Similarly to main spacers 235 described above, main spacers 635 may then be formed over the dummy gate spacers 630, and in the present embodiment, over the etched first protection layer 632 (acting as a spacer liner).

At blocks 510 and 512, the method 500 differs slightly from method 100. A recess is formed in another portion of the fin structure (i.e., a portion other than where the gate structure is formed thereover), and a raised source and drain region is formed, wherein the raised source and drain region fills in the recess. Referring to FIG. 6D, a portion of the fin structure 611 is recessed, designated by the dotted line 636A. The raised source/drain (S/D) regions 636 are formed over the S/D regions of the fin structure 611, including over (and filling in) the recessed portion of the fin structure 636A. The raised S/D regions 636 are similar to the raised S/D regions 236 described and illustrated with reference to FIG. 2D. The raised S/D regions 636 may be in-situ doped.

Figure 6E:
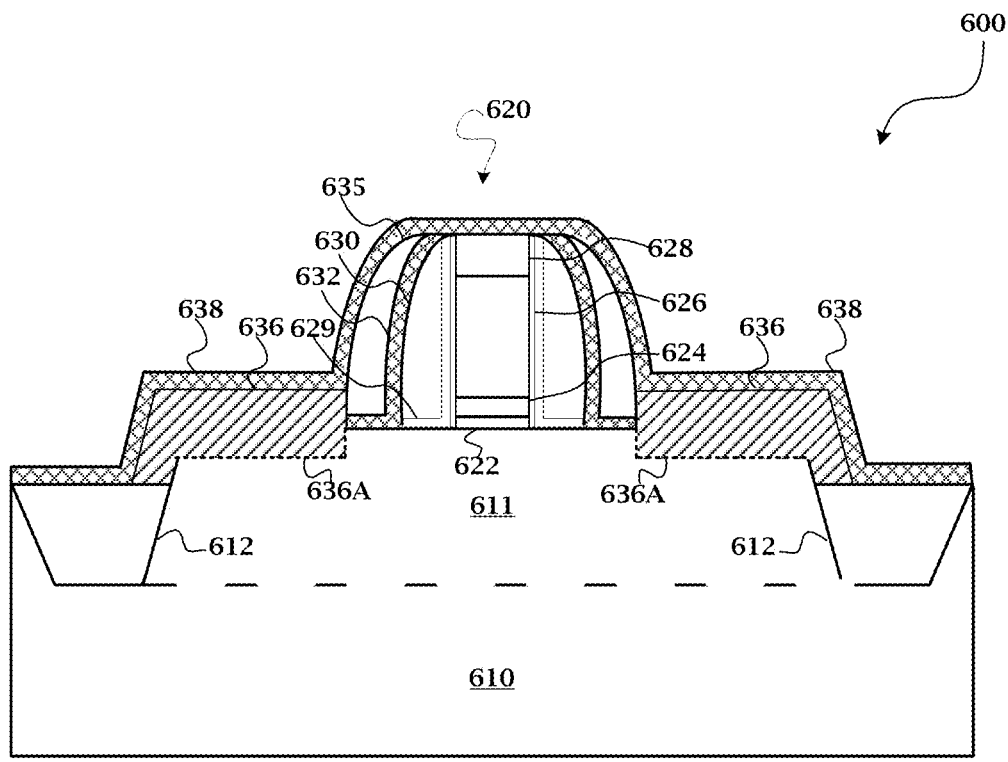
Figure 6E:
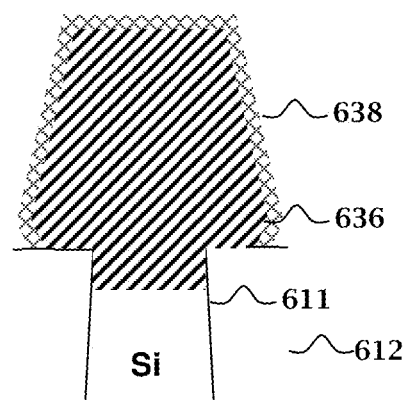
Figure 6F:
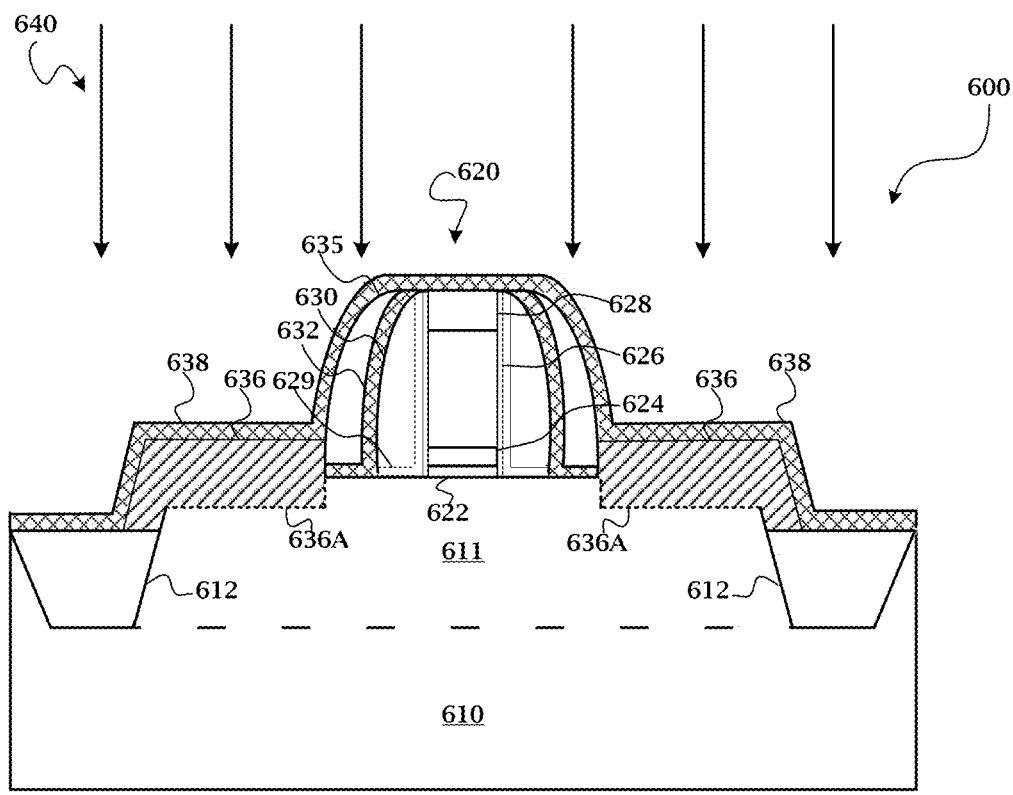
Figure 6F:
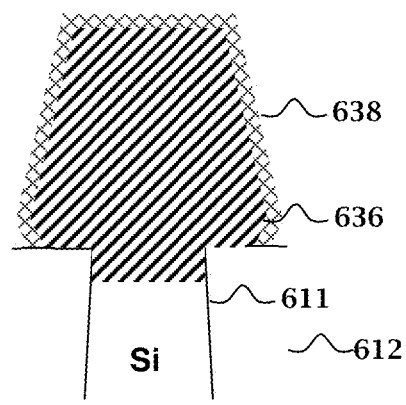

Referring to FIGS. 6E and 6F, at blocks 514 and 516, if the raised S/D regions are not in-situ doped, a second protection layer 638 is formed over the substrate by any suitable process to any suitable thickness, and a second implantation process 640 (i.e., a junction implant process) is performed to dope the raised S/D regions 636. For example, the second protection layer 638 is formed over the substrate 610, fin structure 611, and gate structure 620. The second protection layer 638 may be similar to the first protection layer 634 (and second protection layer 238 described above). The second protection layer 638 may perform one or more functions of a SOP layer, such as serving as a sacrificial layer during surface cleaning and/or material layer stripping processes, an offset for designing junction profile (i.e., a junction design reference), and/or a protection against ion implantation related crystal damage.

The second implantation process 640 may be similar to the second implantation process 240. It is performed through the second protection layer 638, which can act as an offset for designing junction profile. Thus, the thickness of the second protection layer 238 may be varied to design a junction profile (i.e., the thickness is varied to control a junction depth). The second protection layer 638 can also suppress (or eliminate) damage to the substrate 610, fin structure 611, and/or gate structure 620 during the second implantation process 640.

Subsequently, the semiconductor device 600 may undergo further CMOS or MOS technology processing to form various features known in the art. For example, subsequently, a cleaning process may be performed to prepare the surface for S/D contact formation (e.g., S/D silicide formation). The second protection layer 638 may act as a sacrificial layer during the surface cleaning process, such that the second protection layer 638 may be removed during the cleaning process without the substrate 610, fin structure 611 (including raised S/D regions 636), and/or gate structure 620 being affected by the cleaning process. Similarly to the first protection layer 632, for any process performed on the second protection layer 638, the process exhibits an etching selectivity for the second protection layer 638 as compared to the substrate 610 and/or fin structure 611 (which in the present embodiment comprises silicon).

Subsequent processing may form various contacts/vias/lines and multilayer interconnect features (e.g., metal layers and interlayer dielectrics) on the substrate 610, configured to connect the various features or structures of the semiconductor device 600. The additional features may provide electrical interconnection to the device including the formed gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 7:
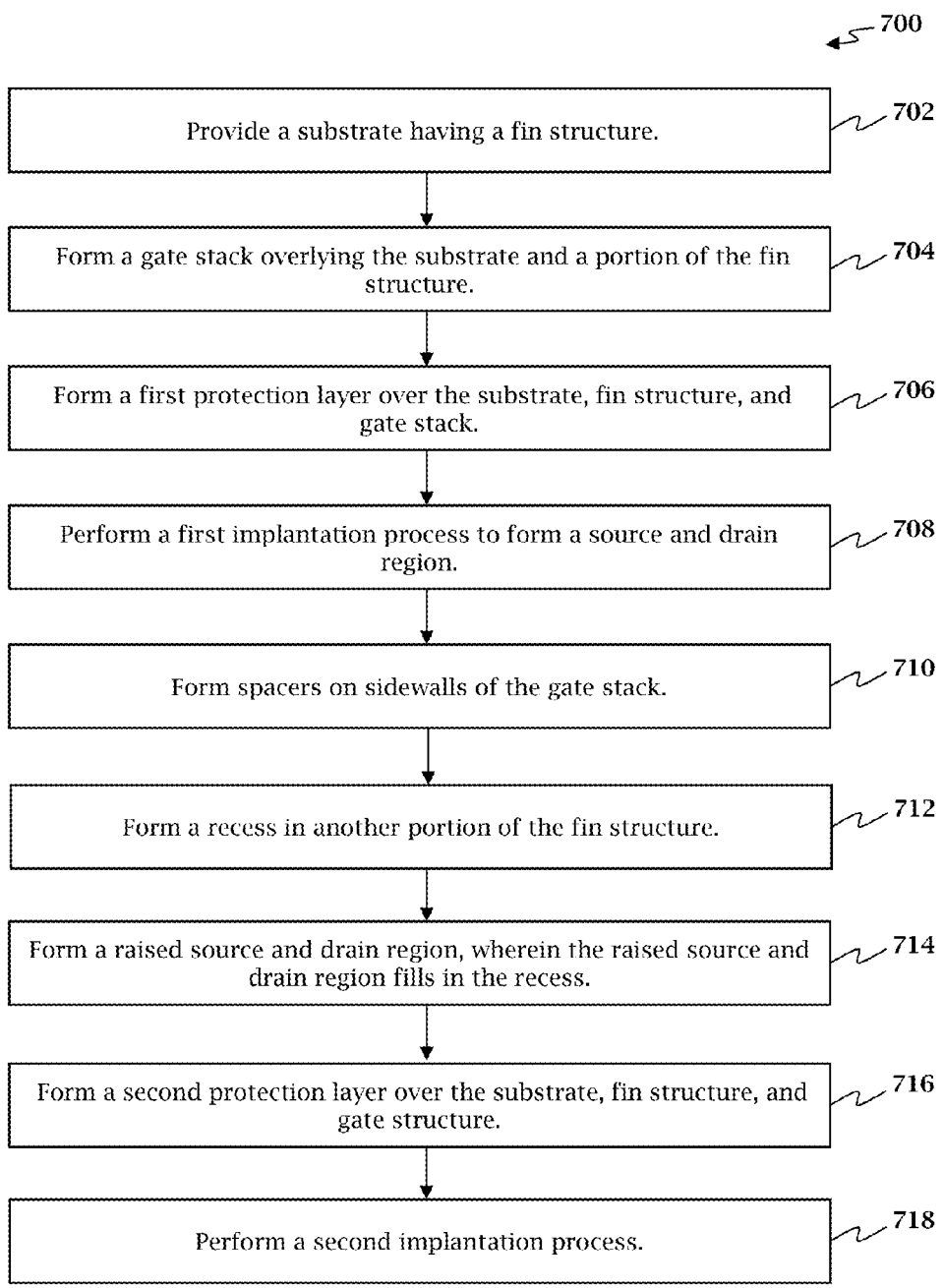
FIG. 7 is a flow chart of a method for fabricating an integrated circuit device according to aspects of the present disclosure.
Figure 8A:
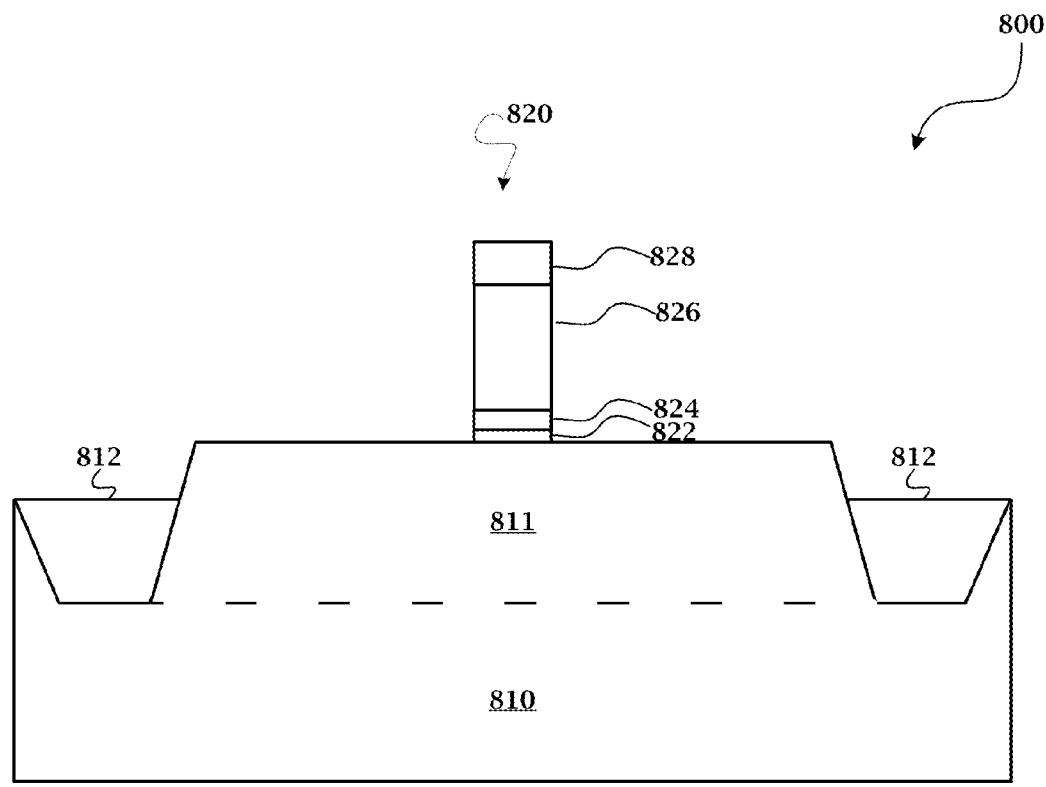
FIGS. 8A-8F are various cross-sectional views of embodiments of an integrated circuit device during various fabrication stages according to the method of FIG. 7.
Figure 8A:
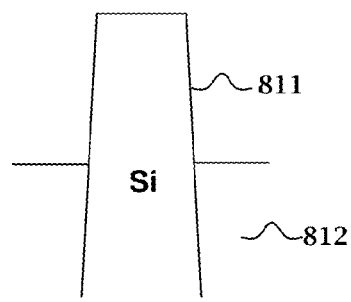

FIG. 7 illustrates a flow chart of an embodiment of the method 700 to fabricate the FinFET device 800. FIGS. 8A-8F are various cross-sectional views of embodiments of the FinFET device 800 during various fabrication stages according to the method 700. The method 700 is similar to method 300 described above. Referring to FIGS. 7 and 8A, similarly to method 300, at block 702, a substrate 810 is provided having a fin structure 811. The substrate 810 also includes exemplary isolation regions 812. At block 704, a gate structure 820 including a gate stack is formed overlying the substrate 810 and a portion of the fin structure 811. The gate stack includes an interfacial layer 822, a gate dielectric layer 824, a gate layer 826, and a hard mask layer 828. The substrate 810, fin structure 811, isolation region 812, gate structure 820, interfacial layer 822, gate dielectric layer 824, gate layer 826, and hard mask layer 828 may be similar to the substrate 410, fin structure 411, isolation region 412, gate structure 420, interfacial layer 422, gate dielectric layer 424, gate layer 426, and hard mask layer 428 as illustrated and described with reference to FIGS. 4A-4F.

Figure 8B:
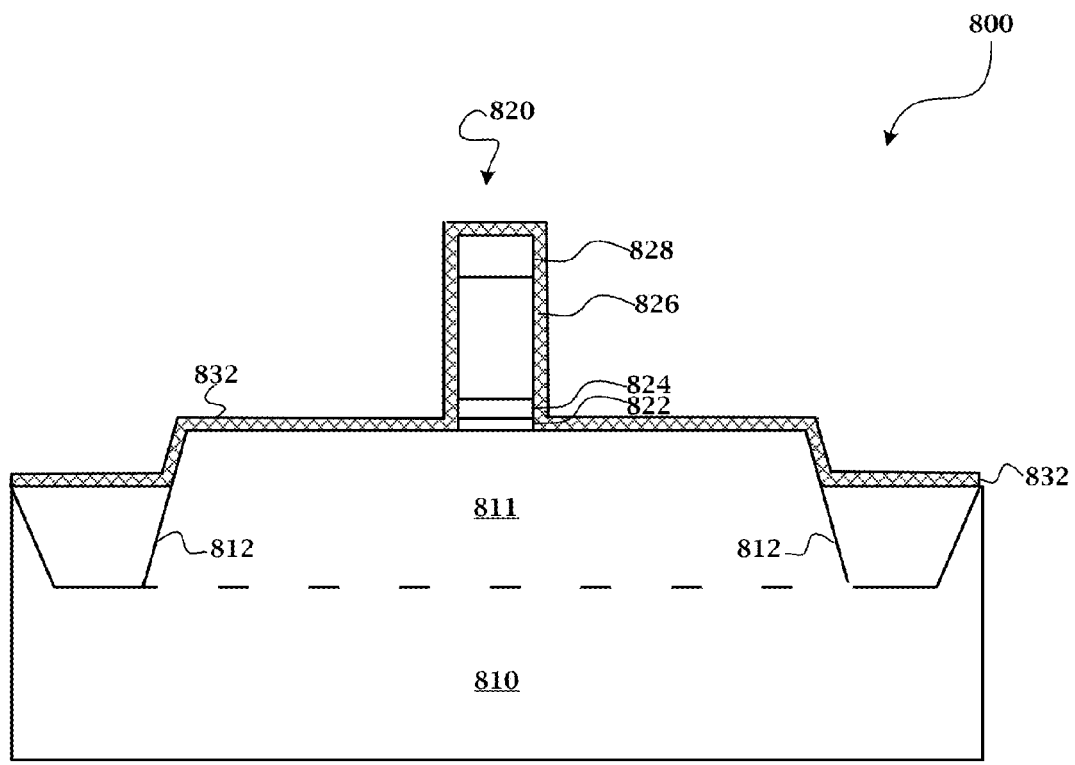
Figure 8B:
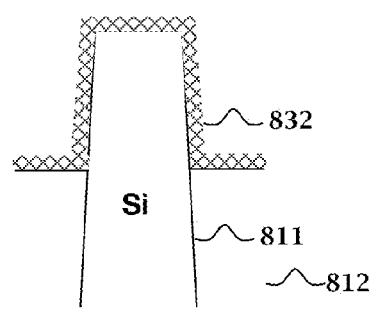

At block 706, a first protection layer is formed over the substrate as illustrated in FIG. 8B. For example, the first protection layer 832 is formed over the substrate 810, fin structure 811, and gate structure 820. The first protection layer 832 may be similar to the first protection layer 432 described with reference to FIG. 4B. The first protection layer 832 may alternatively be referred to as a sacrificial-offset-protection (SOP) layer because, as will be further discussed below, the protection layer 832 serves as (1) a sacrificial layer during surface cleaning and/or material layer stripping processes, (2) an offset for designing junction profile (i.e., a junction design reference), and/or (3) a protection against ion implantation related crystal damage. It is understood that different embodiments may have different advantages, and that no particular advantage is necessarily required of any embodiment. The first protection layer 832 is formed by any suitable process to any suitable thickness. The first protection layer 832 comprises any suitable material, for example, an oxide and/or a nitride material, such as silicon oxynitride. An exemplary first protection layer 832 comprises a low-k dielectric material.

Figure 8C:
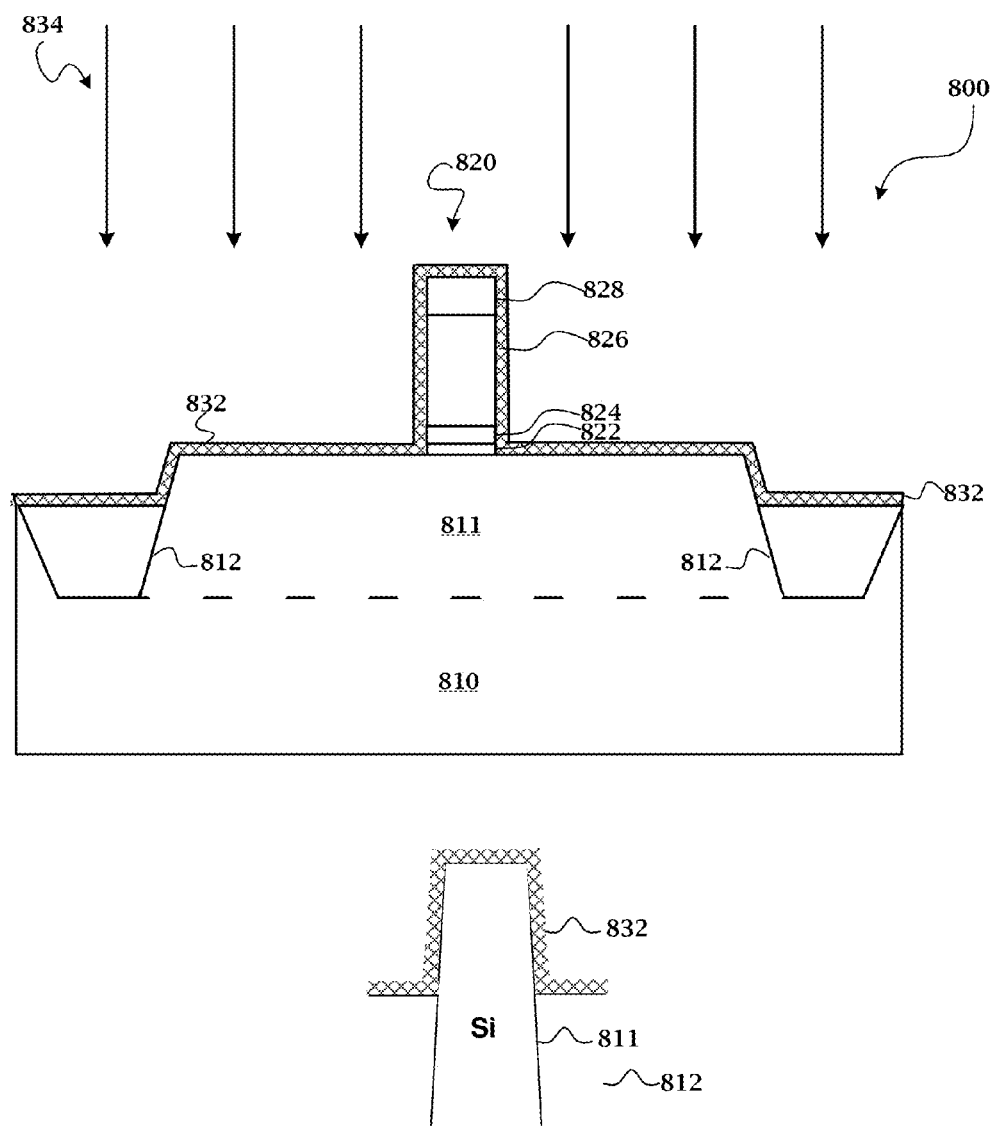

At block 708, a first implantation process 834 (i.e., a junction implant) is performed to form S/D regions as illustrated in FIG. 8C. As noted above, the first protection layer 832 can act as an offset for designing junction profile. Thus, the thickness of the first protection layer 832 may be varied to design a junction profile (i.e., the thickness is varied to control a junction depth). The first protection layer 832 can also suppress (or eliminate) damage to the substrate 810, fin structure 811, and/or gate structure 820 during the first implantation process 834.

Figure 8D:
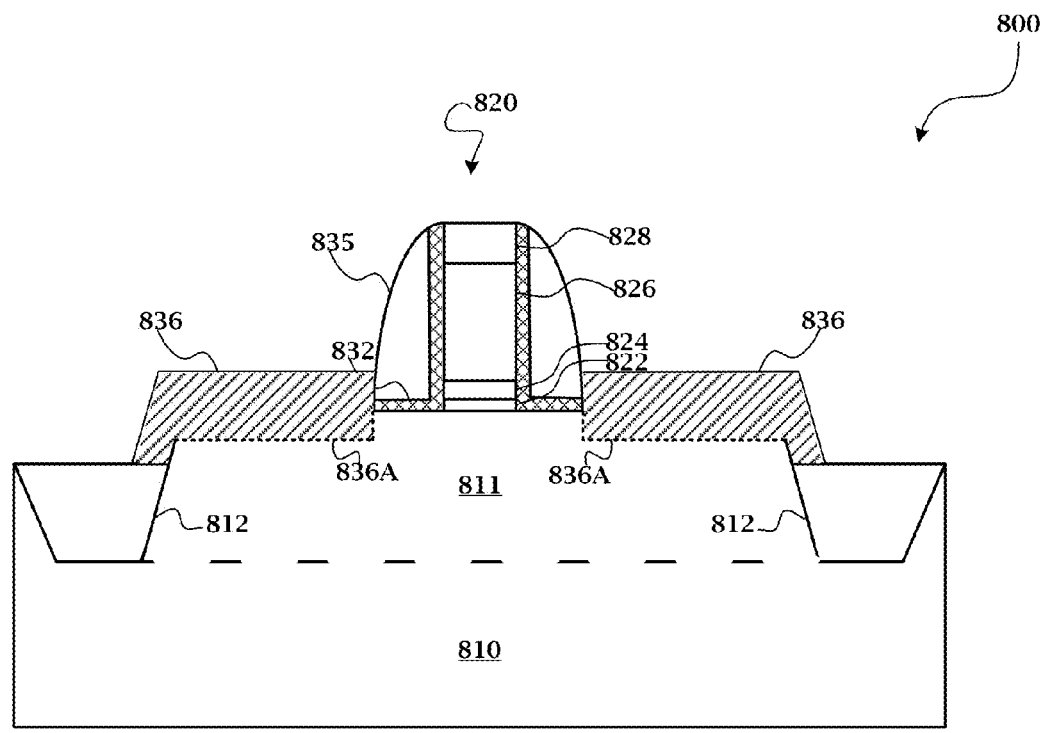
Figure 8D:
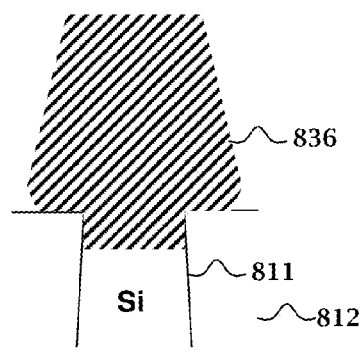

In the present embodiment, after the first implantation process 834, the first protection layer 832 is etched to form a spacer liner as illustrated in FIG. 8D. A surface cleaning process may subsequently be performed to clean the surface for a source/drain epitaxial growth process. Alternatively, a surface cleaning process may be performed, where the first protection layer 832 acts as a sacrificial layer during the surface cleaning process. For example, the first protection layer 832 may be removed during the cleaning process without the substrate 810, fin structure 811, and/or gate structure 820 being affected by the cleaning process. For any process performed on the first protection layer 832, the process exhibits an etching selectivity for the first protection layer 832 as compared to the substrate 810 and/or fin structure 811 (which in the present embodiment comprises silicon).

Similarly to method 300, at block 710 of method 700, main spacers 835 are then formed on the sidewalls of the gate stack, and in the present embodiment, over the etched first protection layer 832 (acting as a spacer liner). The main spacers 835 may be similar to main spacers 435 described above.

At blocks 712 and 714, the method 700 differs slightly from method 300. A recess is formed in another portion of the fin structure (i.e., a portion other than where the gate structure is formed thereover), and a raised source and drain region is formed, wherein the raised source and drain region fills in the recess. Referring to FIG. 8D, a portion of the fin structure 811 is recessed, designated by the dotted line 836A. The raised source/drain (S/D) regions 836 are formed over the S/D regions of the fin structure 811, including over (and filling in) the recessed portion of the fin structure 836A. The raised S/D regions 836 are similar to the raised S/D regions 436 described and illustrated with reference to FIG. 4D. The raised S/D regions 836 may be in-situ doped.

Figure 8E:
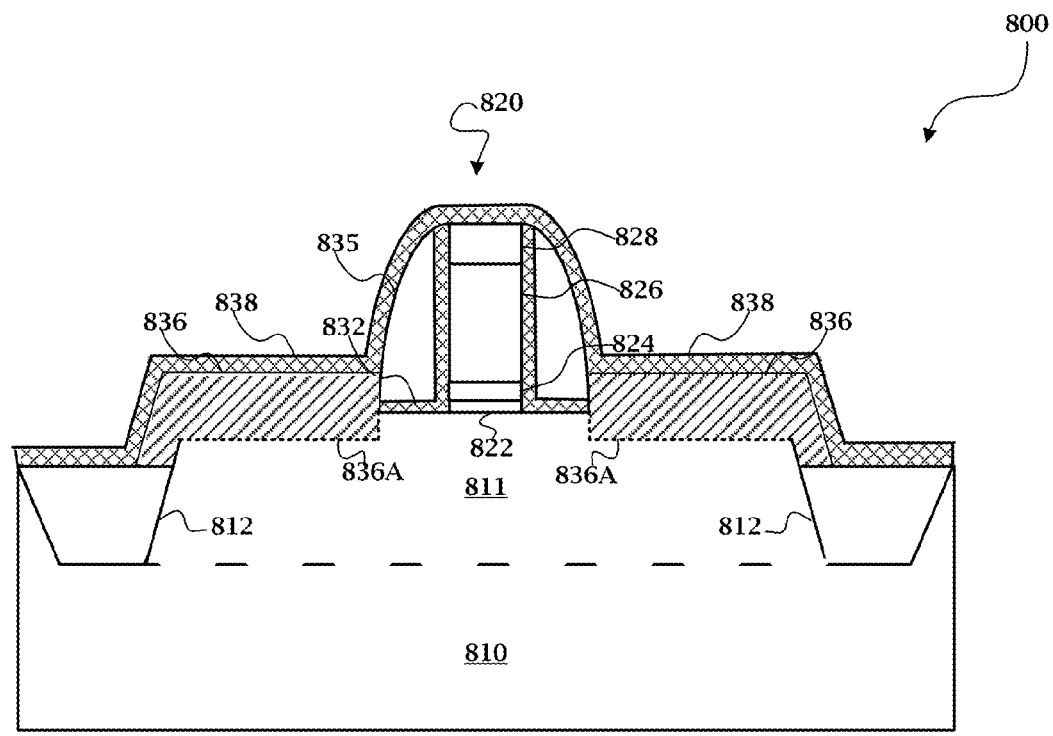
Figure 8E:
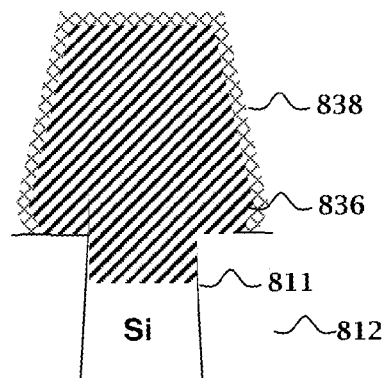
Figure 8F:
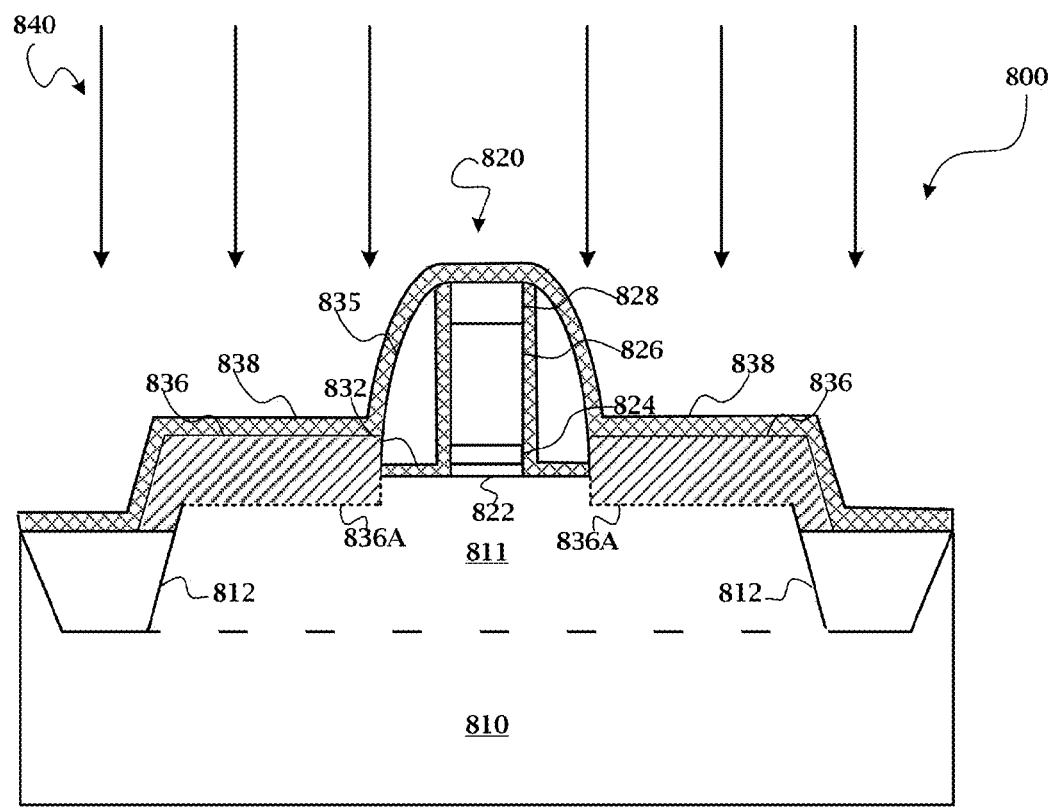
Figure 8F:
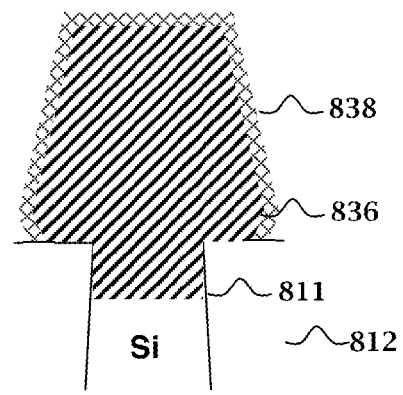

Referring to FIGS. 8E and 8F, at blocks 716 and 718, if the raised S/D regions are not in-situ doped, a second protection layer 838 is formed over the substrate by any suitable process to any suitable thickness, and a second implantation process 840 (i.e., a junction implant process) is performed to dope the raised S/D regions 836. For example, the second protection layer 838 is formed over the substrate 810, fin structure 811, and gate structure 820. The second protection layer 838 may be similar to the first protection layer 834 (and second protection layer 438 described above). The second protection layer 838 may perform one or more functions of a SOP layer, such as serving as a sacrificial layer during surface cleaning and/or material layer stripping processes, an offset for designing junction profile (i.e., a junction design reference), and/or a protection against ion implantation related crystal damage.

The second implantation process 840 may be similar to the second implantation process 440. It is performed through the second protection layer 838, which can act as an offset for designing junction profile. Thus, the thickness of the second protection layer 838 may be varied to design a junction profile (i.e., the thickness is varied to control a junction depth). The second protection layer 838 can also suppress (or eliminate) damage to the substrate 810, fin structure 811, and/or gate structure 820 during the second implantation process 840.

Subsequently, the semiconductor device 800 may undergo further CMOS or MOS technology processing to form various features known in the art. For example, subsequently, a cleaning process may be performed to prepare the surface for S/D contact formation (e.g., S/D silicide formation). The second protection layer 838 may act as a sacrificial layer during the surface cleaning process, such that the second protection layer 838 may be removed during the cleaning process without the substrate 810, fin structure 811 (including raised S/D regions 836), and/or gate structure 820 being affected by the cleaning process. Similarly to the first protection layer 832, for any process performed on the second protection layer 838, the process exhibits an etching selectivity for the second protection layer 838 as compared to the substrate 810 and/or fin structure 811 (which in the present embodiment comprises silicon).

Subsequent processing may form various contacts/vias/lines and multilayer interconnect features (e.g., metal layers and interlayer dielectrics) on the substrate 810, configured to connect the various features or structures of the semiconductor device 800. The additional features may provide electrical interconnection to the device including the formed gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a FinFET device comprising:
providing a substrate having a fin structure;
forming a gate structure, wherein the gate structure overlies a portion of the fin structure;
forming a protection layer over the substrate, fin structure, and gate structure;
after forming the protection layer, performing an implantation process to form a source and drain region in another portion of the fin structure, the another portion of the fin structure having the protection layer disposed thereover during the implantation process;
forming a raised source and drain region over the source and drain region: and
before forming the raised source and drain region, performing a selective etching process, wherein a portion of the protection layer is removed.

2. The method of claim 1 further comprising:
after forming the raised source and drain region, forming another protection layer over the substrate, fin structure, and gate structure; and
performing another implantation process.

3. The method of claim 1 further comprising:
before forming the raised source and drain region, performing a cleaning process, wherein the protection layer is removed.

4. The method of claim 1 wherein forming the protection layer comprises varying a thickness of the protection layer to control a junction profile resulting from the implantation process.

5. The method of claim 1 wherein forming the protection layer comprises depositing an oxide material layer or a nitride material layer.

6. The method of claim 1 wherein forming the raised source and drain region comprises performing an epitaxial growth process.

7. The method of claim 6 wherein performing the epitaxial growth process comprises selectively growing silicon or silicon germanium.

8. The method of claim 1 further comprising:
before forming the raised source and drain region, forming a recess in another portion of the fin structure, wherein the raised source and drain region fills in the recess.

9. A method for fabricating a FinFET device comprising:
providing a substrate having a fin structure;
forming a gate stack, wherein the gate stack overlies a portion of the fin structure;
forming a protection layer over the substrate, fin structure, and gate stack;
after forming the protection layer, performing an implantation process to form a source and drain region;
forming a raised source and drain region over the source and drain region;
after forming the raised source and drain region, forming another protection layer over the substrate, fin structure, and gate structure; and
performing another implantation process.

10. The method of claim 9 wherein forming the raised source and drain region comprises epitaxially growing an in-situ doped layer.

11. The method of claim 9 further comprising:
before forming the raised source and drain region, forming a recess in another portion of the fin structure, wherein the raised source and drain region fills in the recess.

12. The method of claim 9 further comprising performing a cleaning process, wherein the protection layer is removed.

13. The method of claim 9 further comprising performing a selective etching process, wherein a portion of the protection layer is removed.

14. The method of claim 9 wherein forming the protection layer comprises:
determining a thickness of the protection layer to achieve a desired junction depth during the implantation process; and
depositing the protection layer to the determined thickness.

15. The method of claim 9 wherein forming the gate stack comprises:
forming an interfacial layer over the fin structure;
forming a gate dielectric layer over the interfacial layer;
forming a gate layer over the gate dielectric layer;
forming a hard mask layer over the gate layer; and
performing a patterning and etching process.

16. A method for fabricating a FinFET device comprising:
providing a substrate;
forming a fin structure over the substrate;
forming a gate structure, wherein the gate structure overlies a portion of the fin structure;
forming a sacrificial-offset-protection layer over another portion of the fin structure;
thereafter performing an implantation process that implants the another portion of the fin structure through the sacrificial-offset-protection layer;
removing the sacrificial-offset-protection layer; and
forming a raised source and drain region over the another portion of the fin structure.

17. The method of 16 further comprising:
forming another sacrificial-offset-protection layer over the raised source and drain region; and
thereafter performing another implantation process.

18. The method of claim 16, wherein forming the sacrificial-offset-protection layer comprises varying a thickness of the sacrificial-offset-protection layer to control a junction profile resulting from the implantation process.

19. The method of claim 16, further comprising before forming the raised source and drain region, forming a recess in the another portion of the fin structure, wherein the raised source and drain region fills in the recess.

20. The method of claim 16, further comprising before forming the raised source and drain region, performing a cleaning process such that the sacrificial-offset-protection layer is removed.

* * * * *